US012807478B2

(12) United States Patent
Nguyen et al.

(10) Patent No.: US 12,807,478 B2
(45) Date of Patent: Nov. 24, 2026

(54) WAFER LEVEL PROCESSING FOR A MEMS DEVICE WITH CAVITY FORMED THROUGH BACKSIDE PROCESSING

(71) Applicant: TEXAS INSTRUMENTS INCORPORATED, Dallas, TX (US)

(72) Inventors: Hau Nguyen, San Jose, CA (US); Anindya Poddar, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 882 days.

(21) Appl. No.: 17/950,027

(22) Filed: Sep. 21, 2022

(65) Prior Publication Data

US 2023/0092132 A1 Mar. 23, 2023

Related U.S. Application Data

(60) Provisional application No. 63/247,797, filed on Sep. 23, 2021.

(51) Int. Cl.
*H01L 23/498* (2006.01)
*B81B 3/00* (2006.01)
(Continued)

(52) U.S. Cl.
CPC ........... *B81B 3/0072* (2013.01); *B81C 3/001* (2013.01); *H10W 72/0198* (2026.01);
(Continued)

(58) Field of Classification Search
CPC . B81B 3/00072; B81B 7/0009; B81B 7/0016; B81B 7/0029; B81B 7/0032;
(Continued)

(56) References Cited

U.S. PATENT DOCUMENTS 9,676,614 B2 * 6/2017 Johari-Galle ......... B81B 7/0048
11,251,769 B2 * 2/2022 Takano ..................... H03F 1/56
(Continued)

OTHER PUBLICATIONS

PCT Search Report PCT/US2022/044477 mailed Jan. 16, 2023, 5pgs.

*Primary Examiner* — Wael M Fahmy
*Assistant Examiner* — Aneesa Riaz Baig
(74) *Attorney, Agent, or Firm* — Dawn Jos; Charles F. Koch

(57) ABSTRACT

A described example includes: a MEMS component on a device side surface of a first semiconductor substrate; a second semiconductor substrate bonded to the device side surface of the first semiconductor substrate by a first seal patterned to form sidewalls that surround the MEMS component; a third semiconductor substrate having a second seal extending from a surface and bonded to the backside surface of the first semiconductor substrate by the second seal, the second seal forming sidewalls of a gap beneath the MEMS component. A trench extends through the first semiconductor substrate and at least partially surrounds the MEMS component. The third semiconductor substrate is mounted on a package substrate. A bond wire or ribbon bond couples the bond pad to a conductive lead on the package substrate; and mold compound covers the MEMS component, the bond wire, and a portion of the package substrate.

14 Claims, 16 Drawing Sheets

(51) Int. Cl.

| | |
|---|---|
| ***B81C 3/00*** | (2006.01) |
| ***G11C 5/06*** | (2006.01) |
| ***H01L 21/768*** | (2006.01) |
| ***H01L 23/00*** | (2006.01) |
| ***H01L 23/495*** | (2006.01) |
| ***H10B 51/10*** | (2023.01) |
| ***H10B 51/20*** | (2023.01) |
| ***H10D 30/01*** | (2025.01) |
| ***H10D 30/47*** | (2025.01) |
| ***H10D 62/85*** | (2025.01) |
| ***H10D 64/64*** | (2025.01) |
| ***H10H 20/852*** | (2025.01) |
| ***H10H 20/857*** | (2025.01) |
| ***H10W 72/00*** | (2026.01) |
| ***H10W 72/20*** | (2026.01) |
| ***H10W 72/50*** | (2026.01) |
| ***H10W 72/59*** | (2026.01) |
| ***H10W 72/90*** | (2026.01) |
| ***H10W 90/00*** | (2026.01) |

(52) U.S. Cl.

CPC . *B81B 2201/0271* (2013.01); *B81B 2203/033* (2013.01); *B81B 2207/015* (2013.01); *B81B 2207/07* (2013.01); *B81C 2203/019* (2013.01); *B81C 2203/038* (2013.01); *B81C 2203/0771* (2013.01); *H10W 72/253* (2026.01); *H10W 72/536* (2026.01); *H10W 72/859* (2026.01); *H10W 72/865* (2026.01); *H10W 72/877* (2026.01); *H10W 72/879* (2026.01); *H10W 72/884* (2026.01); *H10W 90/722* (2026.01); *H10W 90/732* (2026.01); *H10W 90/734* (2026.01); *H10W 90/736* (2026.01); *H10W 90/752* (2026.01); *H10W 90/754* (2026.01); *H10W 90/756* (2026.01)

(58) Field of Classification Search

CPC ....... B81B 7/0045; B81B 7/48; B81B 7/0054; B81B 2203/0127; B81B 2203/0315–0346; B81B 2207/012; B81B 2207/0127; B81C 1/00325; B81C 1/00825; B81C 2203/00; B81C 2203/01–019; B81C 2203/0118; B81C 1/00238; B81C 1/00269; B81C 3/001; B81C 2203/03; B81C 2203/033; B81C 2203/0785; H01L 2924/1461; H01L 2224/48147; H03H 9/1035; H03H 3/02

See application file for complete search history.

(56) References Cited

U.S. PATENT DOCUMENTS

| | | | | |
|---|---|---|---|---|
| 2013/0270660 | A1 | 10/2013 | Bryzek et al. | |
| 2015/0001651 | A1* | 1/2015 | Faralli | B81B 7/0016 438/51 |
| 2015/0014798 | A1* | 1/2015 | Faralli | G01L 1/00 257/467 |
| 2015/0175406 | A1 | 6/2015 | Lin et al. | |
| 2017/0144881 | A1 | 5/2017 | Baldo et al. | |
| 2019/0207581 | A1* | 7/2019 | Yen | H03H 9/09 |
| 2019/0359480 | A1* | 11/2019 | Kaija | H04B 1/16 |
| 2019/0375627 | A1 | 12/2019 | Cachia et al. | |
| 2020/0035641 | A1* | 1/2020 | Fountain, Jr. | H01L 23/564 |
| 2020/0127633 | A1* | 4/2020 | Takano | H03H 9/02125 |
| 2020/0156114 | A1* | 5/2020 | Gattere | B06B 1/0651 |
| 2021/0380403 | A1* | 12/2021 | Zhang | B81B 7/0048 |
| 2023/0092132 | A1* | 3/2023 | Nguyen | B81C 3/001 257/458 |

* cited by examiner

WAFER LEVEL PROCESSING FOR A MEMS DEVICE WITH CAVITY FORMED THROUGH BACKSIDE PROCESSING

CROSS-REFERENCE TO RELATED APPLICATIONS

This application claims the benefit of and priority to U.S. Provisional Application No. 63/247,797, filed Sep. 23, 2021, which application is hereby incorporated herein by reference in its entirety.

TECHNICAL FIELD

This relates generally to electronic device packaging, and more particularly to a microelectronic device package for a semiconductor die and a micro-electromechanical system (MEMS) component.

BACKGROUND

Certain MEMS devices have characteristics that can be adversely affected by mechanical stress. Examples include precision reference circuits, diodes, filters, sensors, resonators, analog-to-digital converters (ADCs), resistors, capacitors, inductors and coils. In one example a MEMS component is a bulk acoustic wave (BAW) device. The BAW device can be used as a resonator or used as an RF filter and is a stress sensitive component. The MEMS device can be formed on a semiconductor substrate. In some device packages a MEMS device can be formed on a first semiconductor substrate that is placed in proximity to another semiconductor device that is also on a semiconductor substrate. The another semiconductor device can be a driver semiconductor die or controller semiconductor die that is coupled with the MEMS component to form a circuit. In an example with two semiconductor substrates, the first semiconductor substrate and the second semiconductor substrate can be packaged together, for example by mounting the two semiconductor substrates or dies to a package substrate, and then encapsulating the two semiconductor dies and portions of the package substrate in a mold compound.

Mold compound used in microelectronic device packages (often referred to as "epoxy mold compound" or "EMC") is an epoxy resin composition. The mold compound can be filled with solid particles such as silica or aluminum oxide particles. Filler can comprise over 90% of the mold compound by weight. The mold compound is either a liquid at room temperature or a solid at room temperature. If a solid at room temperature, it can be heated to a liquid state before being used in molding. To form the microelectronic device package the liquid mold compound is injected or otherwise transferred into a mold containing the package substrate and the semiconductor die or dies. After the mold compound cools, the packaged devices are removed from the mold. During curing and cooling the mold compound shrinks and applies either compressive and/or shear stress to the dies and to components in the packaged device. Mold compounds can have curing stresses in the range of twenty to several hundred mega (million) pascals (MPa). Mold compound curing stress and coefficient of thermal expansion (CTE) mismatch can induce stress on the semiconductor die or dies in the range of ten to several hundred MPa. Stress on the semiconductor die and on the MEMS component can be amplified when concentrated by points on filler particles within the mold compound that are pressing against the semiconductor die or the MEMS component. Larger filler particles concentrate more stress and apply more pressure against the devices.

A MEMS component may have electrical properties that are adversely changed by mechanical stress including compressive and/or tensile stress. Due to point stress sources in the mold compound, in some examples packaged devices produced in the same packaging process may have different localized stress effects, resulting in non-uniform performance of like packaged devices across completed units in a single lot, or similarly across different lots of the packaged semiconductor devices. As the mold compound ages and as the microelectronic packaged devices are operated over many cycles, the mechanical stress from the mold compound can change, creating different mechanical stress than was present when the device was first produced and changing electrical performance of the MEMS component over time. Trimming or tuning steps performed at initial manufacture to compensate for the mechanical stresses are then made ineffective.

SUMMARY

In a described example, a method includes: forming a MEMS component on a device side surface of a first semiconductor substrate, the first semiconductor substrate having a backside surface opposite the device side surface, and forming at least one bond pad electrically coupled to and spaced from the MEMS component. The method continues by forming a first polymer seal structure corresponding to the location of the MEMS component and extending from a device side surface of a second semiconductor substrate, the second semiconductor substrate having a backside surface opposite the device side surface of the second semiconductor substrate; and bonding the second semiconductor substrate to the first semiconductor substrate using the first polymer seal structure. The device side surface of the second semiconductor substrate is positioned facing the MEMS component on the device side surface of the first semiconductor substrate and forming a top surface of a cavity, the first polymer seal structure forming sidewalls of the cavity, the cavity including the MEMS component, and the bond pad being outside of the cavity.

The method continues by performing backside processing on the first semiconductor substrate to form a trench through the first semiconductor substrate, the trench at least partially surrounding the MEMS component; patterning a second polymer seal structure extending from a device side surface of a third semiconductor substrate corresponding to the MEMS component locations on the first semiconductor substrate; and bonding the third semiconductor substrate to the backside surface of the first semiconductor substrate using the second polymer seal structure to form a gap beneath the MEMS component, the second polymer seal structure forming sidewalls of the gap, the device side surface of the third semiconductor substrate forming a bottom surface of the gap.

In another described example, an apparatus includes: a MEMS component on a device side surface of a first semiconductor substrate; a second semiconductor substrate bonded to the device side surface of the first semiconductor substrate by a first seal patterned to form sidewalls that surround the MEMS component; a third semiconductor substrate having a second seal extending from a surface and being bonded to the backside surface of the first semiconductor substrate by the second seal, the second seal forming sidewalls of a gap beneath the MEMS component; a trench extending through the first semiconductor substrate and at least partially surrounding the MEMS component; the third semiconductor substrate mounted to a die pad on a package substrate; a bond wire or ribbon bond coupling the bond pad to a conductive lead on the package substrate; and mold compound covering the MEMS component, the bond wire, and a portion of the package substrate.

Additional alternative examples are described.

DETAILED DESCRIPTION

Figure 1A:
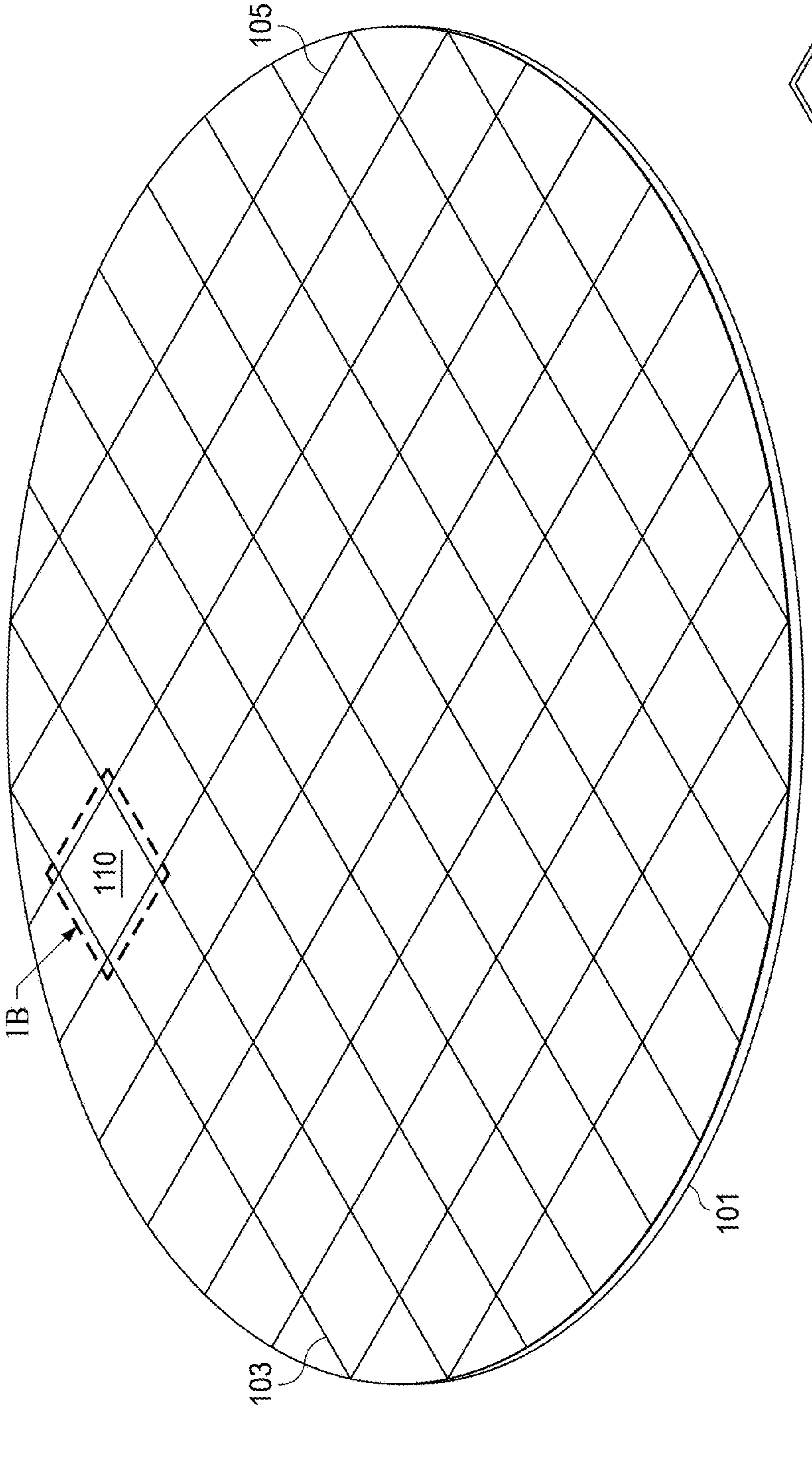
FIGS. 1A-1B illustrate in projection views a semiconductor wafer with device dies and a unit semiconductor device die, respectively.

Corresponding numerals and symbols in the different figures generally refer to corresponding parts unless otherwise indicated. The figures are not necessarily drawn to scale.

The term "package substrate" is used herein. A package substrate is a support having a surface suitable for mounting a semiconductor device. In the arrangements, useful package substrates can include: multilayer package substrates including conductors and dielectrics built up by additive processes to form the substrate, molded interconnect substrates (MIS); pre-molded lead frames (PMLFs) with lead frame conductors and dielectric material in a preformed structure; tape based and film-based substrates carrying conductors; laminate substrates with multiple layers of conductors and insulator layers; and printed circuit board substrates of ceramic, plastic, fiberglass or resin, such as flame retardant 4 (FR4) substrates. Lead frames that are "half-etched" or "partially etched" to form portions of different thicknesses, or to form openings in metal layers, can be used. In the example arrangements, a lead frame is used as a package substrate and has a die side surface and an opposing board side surface. Parts of leads of the lead frame form terminals for a packaged semiconductor device, and a unit semiconductor device including the MEMS component is mounted on the lead frame. Bond pads on the semiconductor substrates are used to form electrical connections to the leads of the lead frame using bond wires or ribbon bonds.

The term "wafer level encapsulation" is used herein. Wafer level encapsulation is a process for forming semiconductor devices by bonding wafers together prior to singulating the wafers into unit devices. By performing processes at the wafer level, yield is increased and costs are reduced, when compared to processing individual semiconductor dies.

In the arrangements, unwanted mechanical stress on a component is reduced or eliminated by use of a wafer level encapsulation process that forms a cavity around a MEMS component. The MEMS component is provided on a device side surface of a first semiconductor substrate or wafer. A second semiconductor substrate or wafer, which in an example arrangement does not have devices formed on it (alternatively, the second semiconductor substrate can have devices formed in it), is provided with a silicon dioxide or other dielectric layer. A first seal is formed on the second semiconductor substrate. In an example process a polymer that can be patterned, such as a photoresist polymer, is formed on the dielectric layer. Patterning using photolithography and etch steps form the first seal of the polymer with sidewalls extending from the second semiconductor wafer that correspond to the locations of MEMS components on the first semiconductor wafer. A wafer bonding process using the polymer bonds the second semiconductor wafer to the first semiconductor wafer, so that the MEMS components are covered by the second semiconductor wafer and the sidewalls of the first seal surround the MEMS components.

Backside processing on the backside of the first semiconductor wafer forms trenches partially around or completely surrounding the MEMS components so that the MEMS components are mechanically released from the remainder of the first semiconductor substrate, and the MEMS components are mounted in a cavity surrounding the components. A third semiconductor wafer is then bonded to the backside surface of the first semiconductor wafer using a second seal to enclose the MEMS component in the cavity. The combined assembly of the first semiconductor wafer, the second semiconductor wafer, and the third semiconductor wafer is then separated into unit semiconductor devices in a wafer level singulation process. The unit semiconductor devices have a MEMS component in a cavity covered by the second semiconductor substrate, which forms a cap or lid, and surrounded by a first seal formed of the polymer sidewalls. The trenches in the first semiconductor substrate mechanically release the MEMS devices, while the third semiconductor substrate forms a bottom of the cavity spaced from the MEMS component by a gap and the third semiconductor substrate and a second seal closes the bottom of the cavity.

A unit semiconductor device of the arrangements can then be mounted to a die mounting area of a package substrate using a die attach film or a die attach epoxy. Wire bonding or ribbon bonding can connect the MEMS component to conductive leads of the package substrate. In an example arrangement, the third semiconductor substrate can include a driver integrated circuit or other circuit that is electrically coupled to the MEMS component. In an additional arrangement, the third semiconductor wafer is a carrier, and the unit devices are later stacked on another semiconductor device die that is mounted on the package substrate, the unit devices including the MEMS component can then be connected to the another semiconductor die with wire bonds or ribbon bonds to form a circuit. The assembly including the unit devices and the package substrate can be covered with mold compound to form an integrated system provided in the microelectronic device package.

The use of the cavity surrounding the MEMS components in the arrangements reduces or eliminates mechanical stress from the mold compound from causing stress on the MEMS components, by spacing the MEMS component from the mold compound. In an example the MEMS component is a BAW device. The package substrate can be a lead frame, a partially molded lead frame, a half etched lead frame, or a molded interconnect substrate. A multilayer package substrate formed by additive or build up manufacturing can be used. The microelectronics device package can be a quad flat no-lead (QFN) or other no-lead package, where parts of the package substrate form terminals for the packaged device that are coextensive with the molded package body. In additional alternatives, leaded device package types can be used.

After molding, the microelectronic device packages including the MEMS components can be separated from one another by sawing through the package substrate and the mold compound along saw streets formed between the molded microelectronic package devices.

Use of the arrangements results in reducing or eliminating adverse changes in performance characteristics of the MEMS components due to mechanical stress (when compared to similar microelectronic device packages formed without use of the arrangements.) Use of the arrangements also prevents stress on the MEMS component without the need for a glob top low modulus material, which enables further flexibility in bond pad positions, and allows additional size reductions of the MEMS component and the first semiconductor substrate that carries the MEMS device.

Figure 1B:
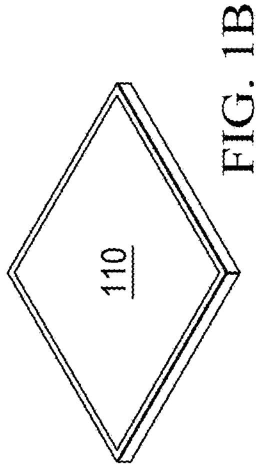

FIGS. 1A-1B illustrate, in projection views, a semiconductor wafer and a semiconductor die useful in the arrangements. In FIG. 1A, a semiconductor wafer includes semiconductor dies 110 in an array of rows and columns of identical dies. The dies 110 can be integrated circuits, such as an integrated circuit driver device. In an example arrangement, the dies 110 can be a component, such as a passive component, a sensor, a bulk acoustic wave (BAW) device, a resistor, capacitor, inductor, transducer, temperature sensor, optical sensor, or coil. The dies 110 can include a MEMS component that has electrical characteristics that change undesirably when exposed to mechanical stress. In a specific example a BAW device is the MEMS component.

Wafer 101 has scribe lines 103 arranged in a first direction and scribe lines 105 arranged in a second direction that is normal to the first direction. When fabrication of the semiconductor dies 110 is complete, the semiconductor dies 110 are singulated from the wafer 101 using wafer dicing tools such as a dicing saw, or using laser cutting tools to cut along the scribe lines. FIG. 1B illustrates in a projection view one semiconductor die 110 that has been removed from wafer 101.

Figure 2:
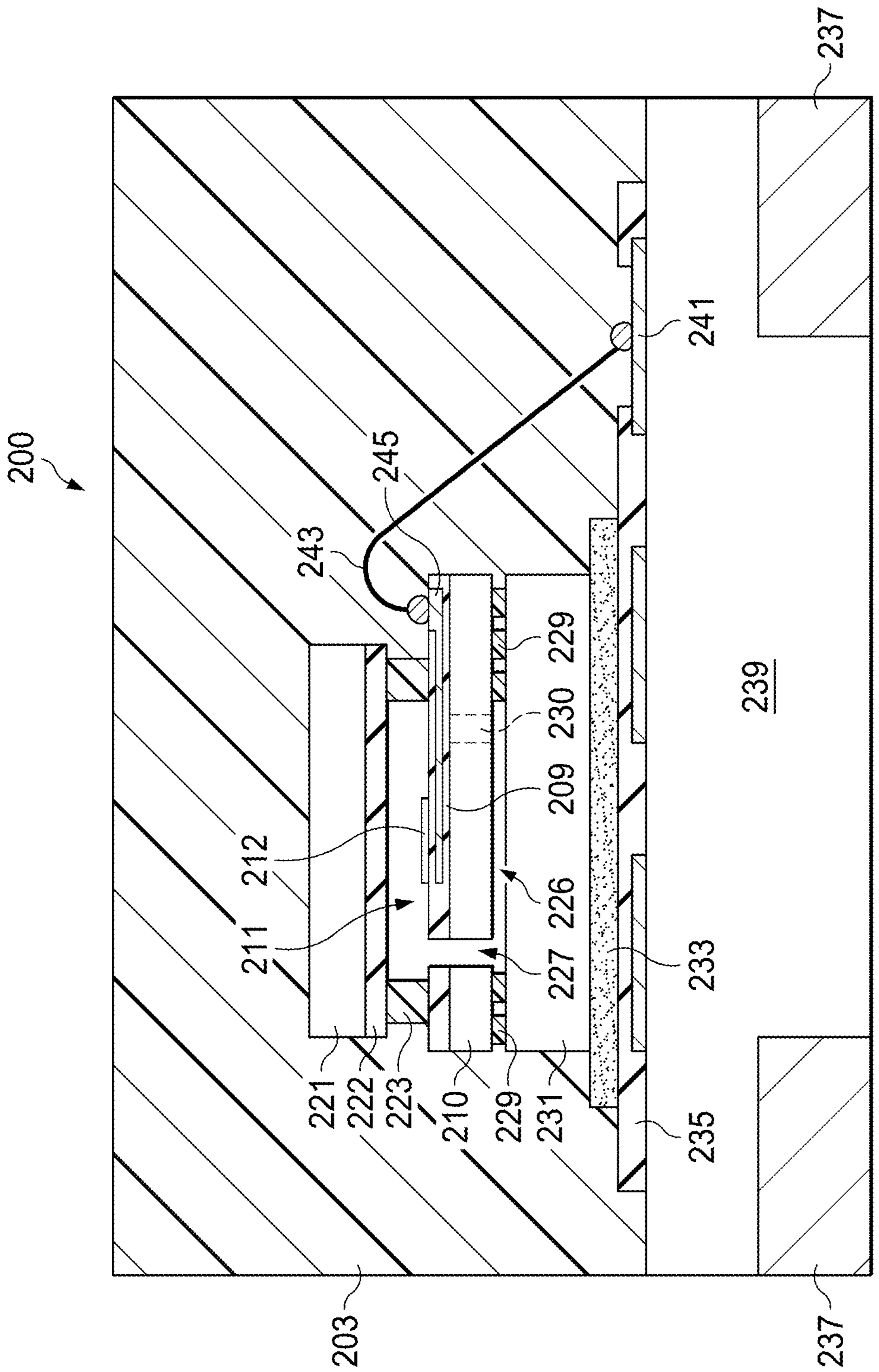
FIG. 2 illustrates, in a cross sectional view, a microelectronics device package including an arrangement.

FIG. 2 illustrates, in a cross sectional view, a microelectronics device package of an arrangement 200 including a MEMS component 212 on a device side surface of a first semiconductor substrate 210. Package 200 is a no lead semiconductor device package, referred to as a "no lead" package because terminals 237, part of a package substrate 239, do not extend beyond the periphery of a package body formed by the mold compound 203. In the example of FIG. 2 the MEMS component 212 can be a BAW device formed on the first semiconductor substrate 210. Other MEMS components can be formed that are also stress sensitive components. In FIG. 2, the MEMS component 212 is formed on first semiconductor substrate 210 with a device side surface of the first semiconductor substrate 210 facing away from the package substrate 239, or "face up." A bond pad 245 on the first semiconductor substrate 210 is electrically coupled to the MEMS component 212 and is connected by a wire bond 243 to a conductive land 241 on the package substrate 239. A protective overcoat layer 209 is over the device side surface of the first semiconductor substrate 210 and over conductor traces that couple the MEMS component 212 to a bond pad. The protective overcoat ("PO") layer is used to protect devices formed on a semiconductor substrate and can be formed of a polyimide, an oxide, a nitride, or combinations of these or other insulating materials. In some example arrangements, the PO layer is etched through when a trench is formed at least partially surrounding the MEMS component 212. In other arrangements, the PO layer is retained to provide mechanical support for a MEMS component 212 that is partially or completely surrounded by a trench through the semiconductor substrate 210. Conductive traces over the device side surface of the first semiconductor substrate 210 can couple the MEMS component 212, or other electrical components, to bond pads such as bond pad 245 on the device side surface of the first semiconductor substrate 210. The PO layer will be over and protect the conductive traces, which can also provide mechanical support to the MEMS component 212 after the trenches are formed.

As die sizes and semiconductor package sizes continue to fall with further advances in semiconductor processes, it is desirable to shrink the packages for the semiconductor devices including the MEMS component. It is also desirable to reduce costs, for example by eliminating materials. In prior approaches a low modulus glob top material was used to cover the MEMS component as a method to reduce mechanical stress on the MEMS component. Glob top material interferes with wire bonding, so to make the packaged devices, minimum spacing distance is needed between the outer periphery of the glob top material and the bond pads, which limits the flexibility in the placement of the bond pads and also acts as a limit on the ability to shrink the first semiconductor substrate 210. Use of the arrangements eliminates the need for glob top material.

In the arrangements a second semiconductor substrate 221 is bonded to the first semiconductor substrate 210 over the MEMS component 212 to form a cap or lid spaced from the MEMS component 212. A first seal 223 is shown in the cross section in FIG. 2, first seal 223 surrounds the MEMS component 212, while the bond pad 245 is placed outside the first seal 223. The first seal 223 can be a polymer. In an example process, the polymer used is a photoresist, that is, it is light sensitive and can be patterned using photolithography steps including masking, exposure, development, and etch. The polymer can be a photoresist polymer that cross links to form a harder material when exposed to particular light frequency such as UV for a predetermined time, hardening the exposed polymer and enabling the unexposed polymer to be removed. The polymer used for the first seal 223 is also used, in an example process, to bond wafers so that a wafer level encapsulation process can be utilized to form unit semiconductor devices efficiently, and at relatively low cost.

A trench 227 is shown extending through a portion of the first semiconductor substrate 210, this trench 227 forms part of the cavity 211 that surrounds the MEMS component 212, and also serves to mechanically stress release the MEMS component 212 from the remaining portion of the semiconductor substrate 210. A second seal 229 is used to bond a third semiconductor substrate 231 to the backside surface of the first semiconductor substrate 210 and is spaced from the first semiconductor substrate 210 by a gap 226 that is connected to and part of the cavity 211 that surrounds the MEMS component 212. The second seal 229 is also formed using a photoresist polymer and the second seal 229 is used to bond the third substrate 231 to the first substrate 210 in a further wafer bonding process in a wafer level encapsulation process that is cost effective.

A die attach film or a die attach epoxy forms die attach 233 that mounts the unit semiconductor device formed by the first semiconductor substrate 210, the second semiconductor substrate 221, and the third semiconductor substrate 231, to the package substrate 239. The package substrate 239 has an additional protective overcoat layer 235 over the device side surface of the package substrate 239. In the example of FIG. 2, the package substrate 239 can be a multilayer package substrate formed by an additive build up process using a dielectric film such as Ajinomoto Build Up Film (ABF) and using metal plating and grinding or polishing steps to form patterned layers of conductors spaced by dielectric material. ABF is commercially available from the Ajinomoto Co., Inc., of Tokyo Japan, and is an epoxy resin film used to form package substrates. Vertical connection layers and horizontal trace layers can be formed in a multilayer package substrate. A conductive land 241 is connected to one of the terminals 237 by conductors and by vertical connectors (not shown) in the multilayer package substrate 239. Mold compound 203 is used to form the body of the microelectronics device package 200. The cavity 211 formed by the second semiconductor substrate 221, the first seal 223, the trench 227, gap 226, the second seal 229, and the third semiconductor substrate 231 spaces the MEMS component 212 from the mold compound 203. Stress from mold compound 203 does not affect the MEMS device 212, which is mechanically isolated from the mold compound 203. The trench 227 further reduces the possibility that stress on portions of the first semiconductor substrate 210 can affect the MEMS component 212 by releasing the MEMS component 212 from the remainder of the first substrate 210.

Figure 3A:
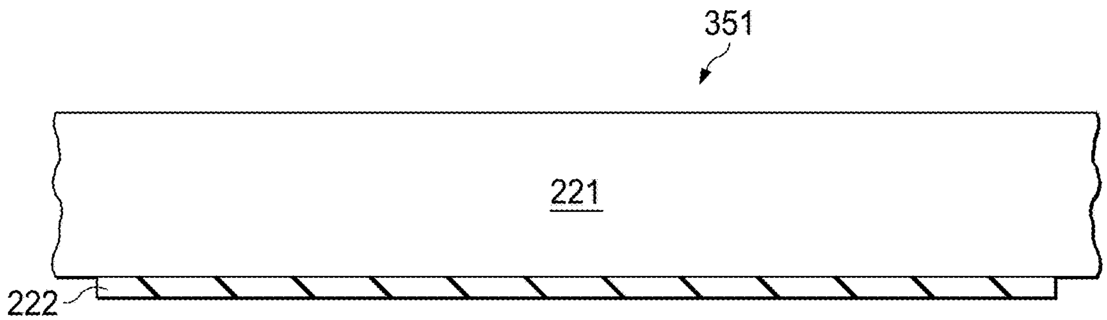
FIGS. 3A-3P illustrate, in a series of cross sectional views, selected steps for forming a unit device for use in the arrangements.
Figure 3B:
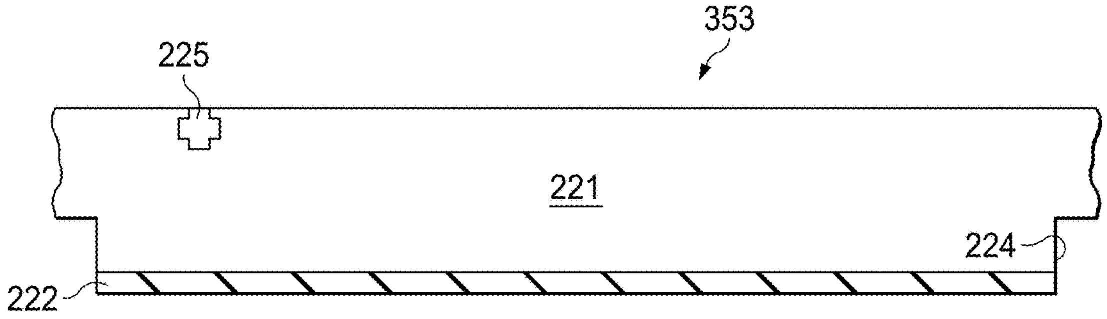
Figure 3C:
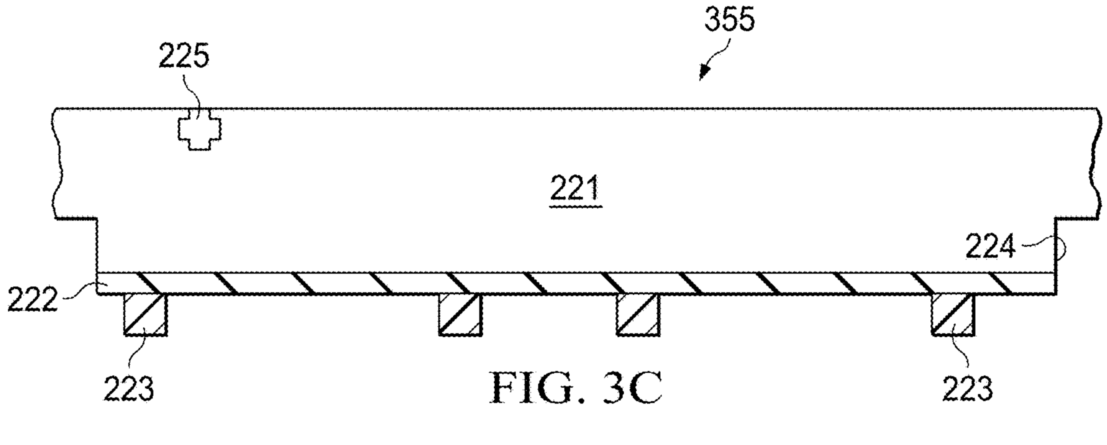
Figure 3D:
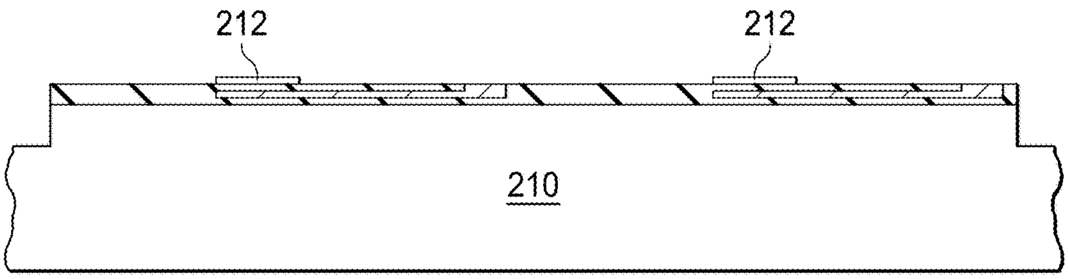
Figure 3E:
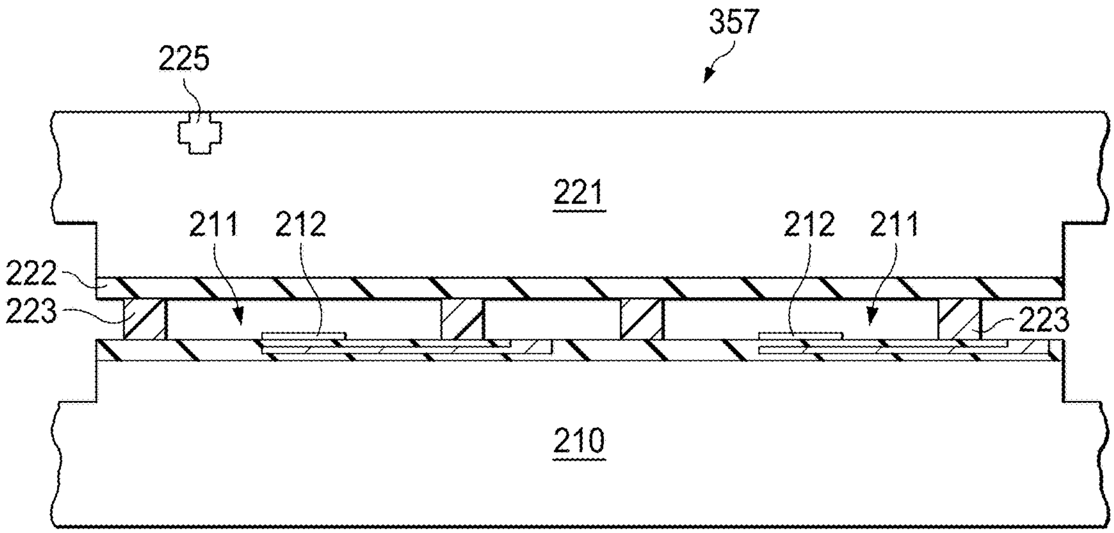
Figure 3F:
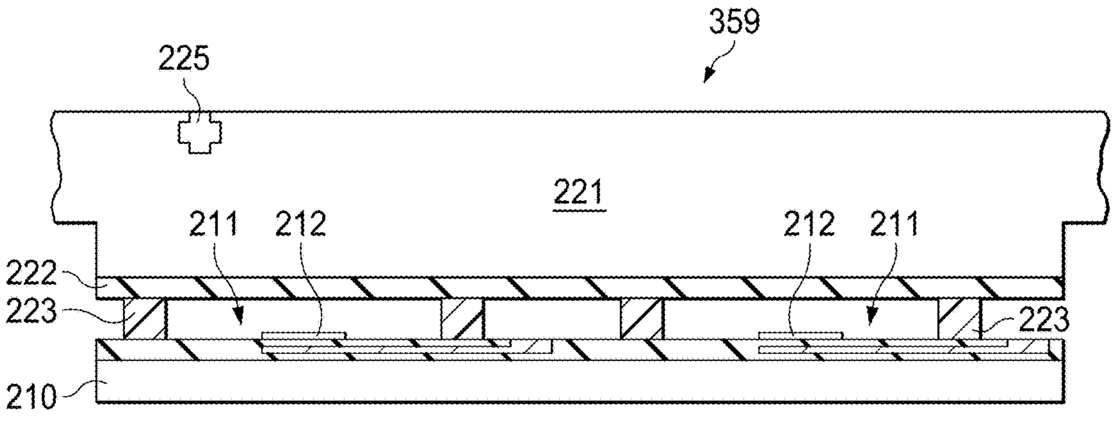
Figure 3G:
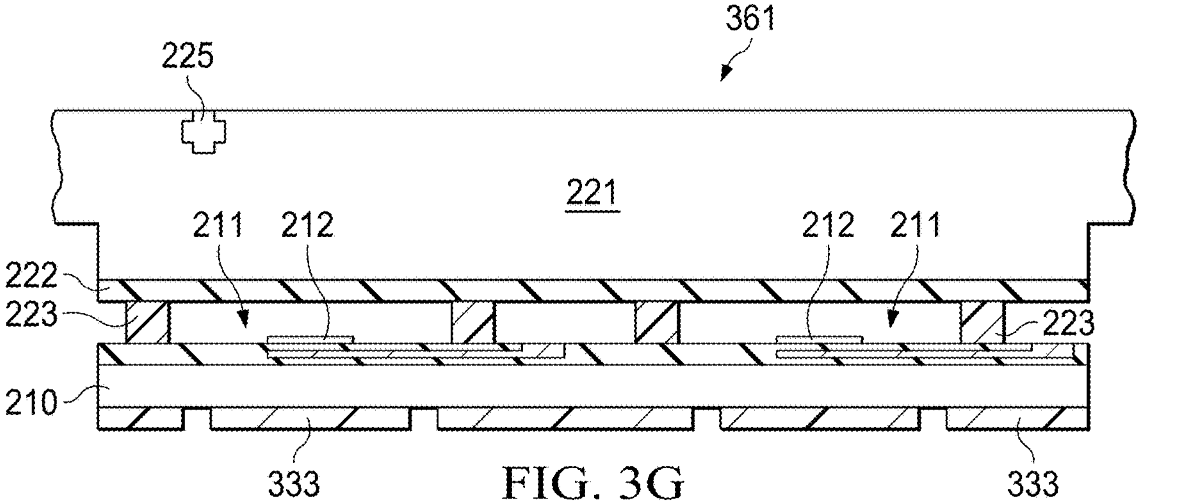
Figure 3H:
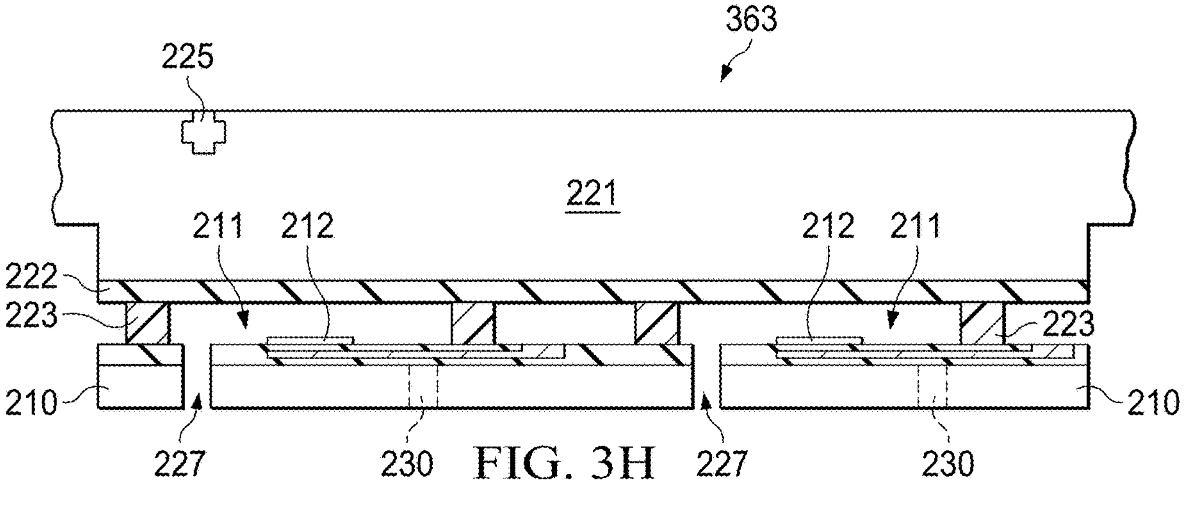
Figure 3I:
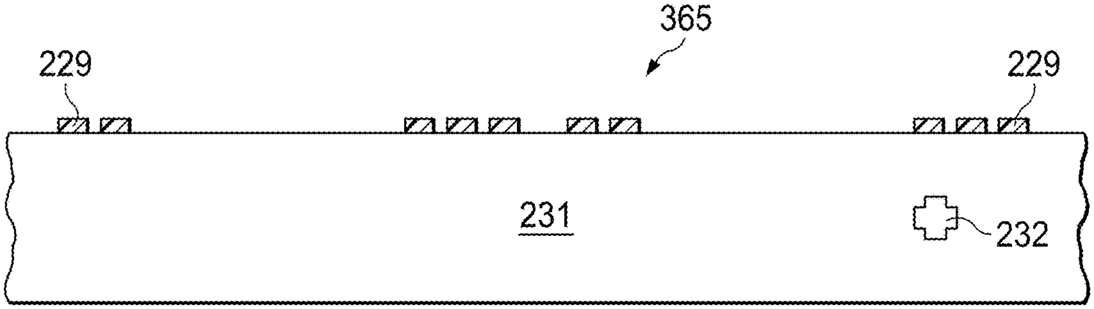
Figure 3J:
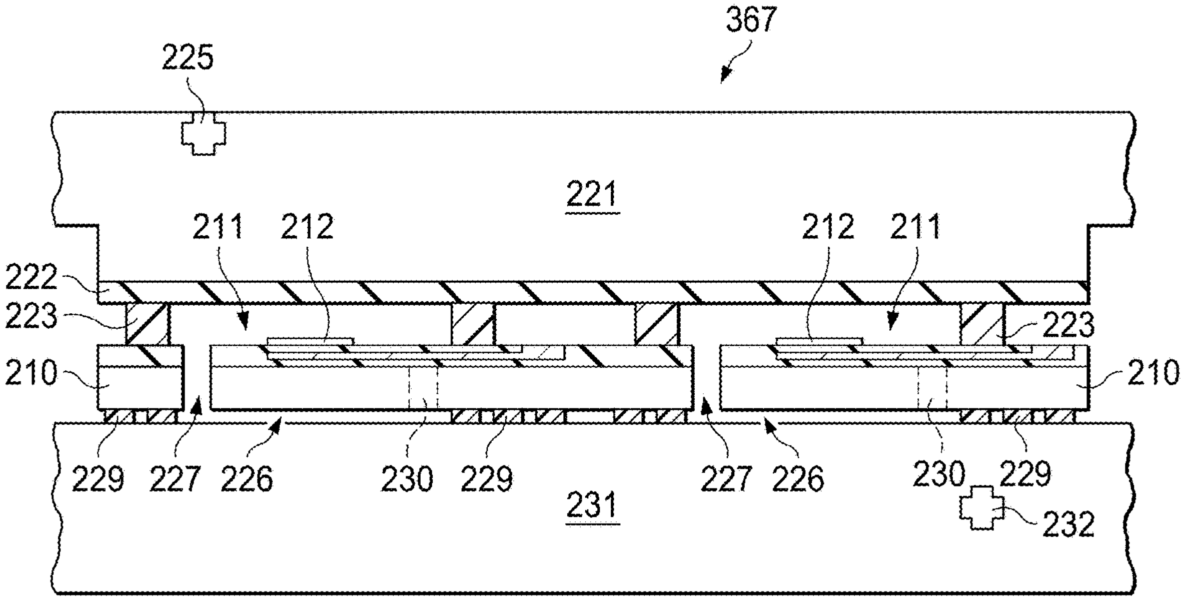
Figure 3K:
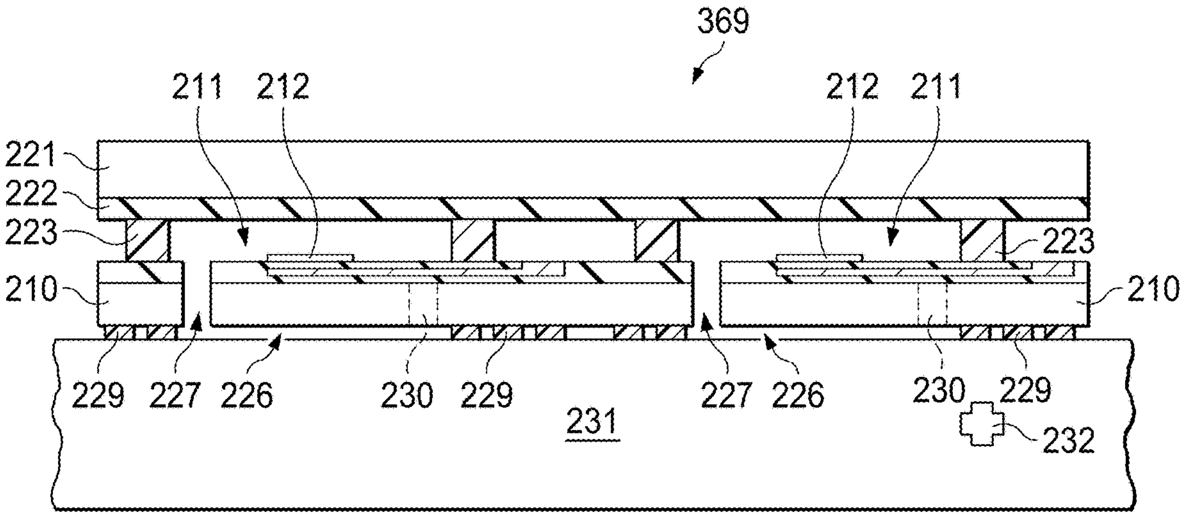
Figure 3L:
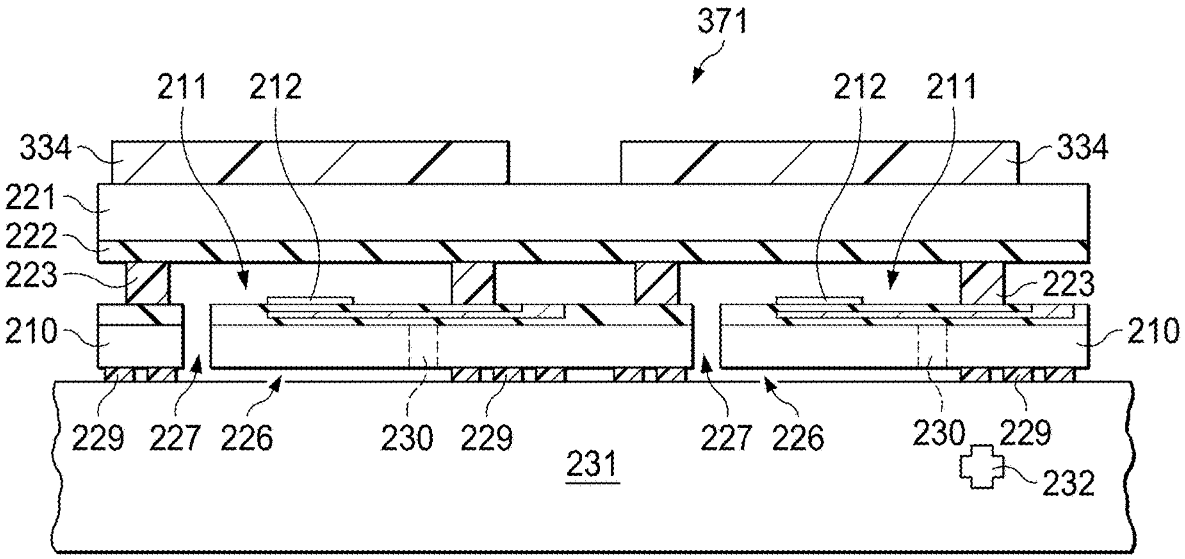
Figure 3M:
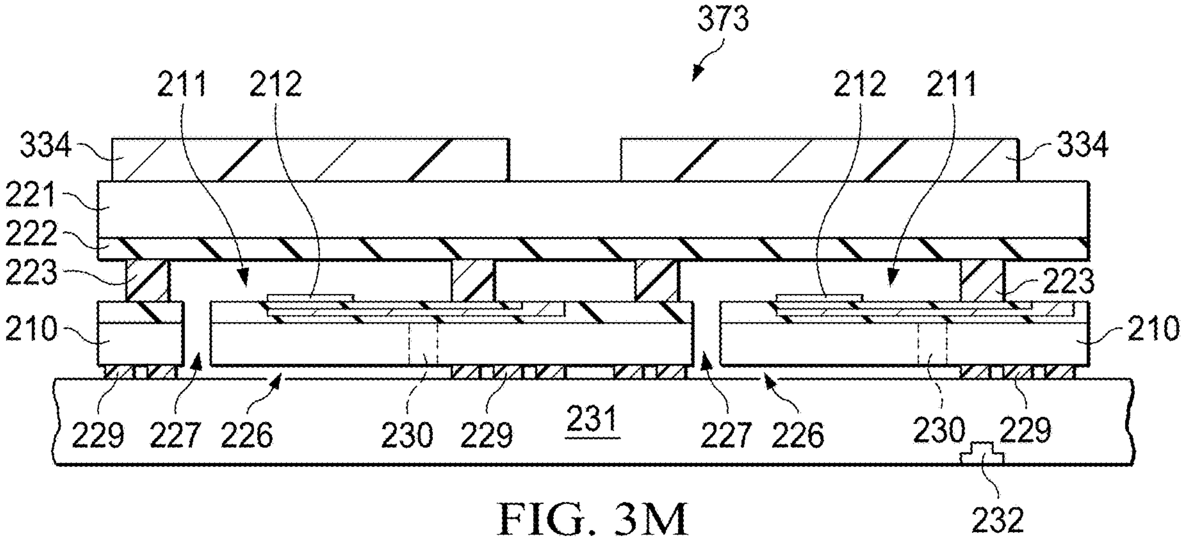
Figure 3N:
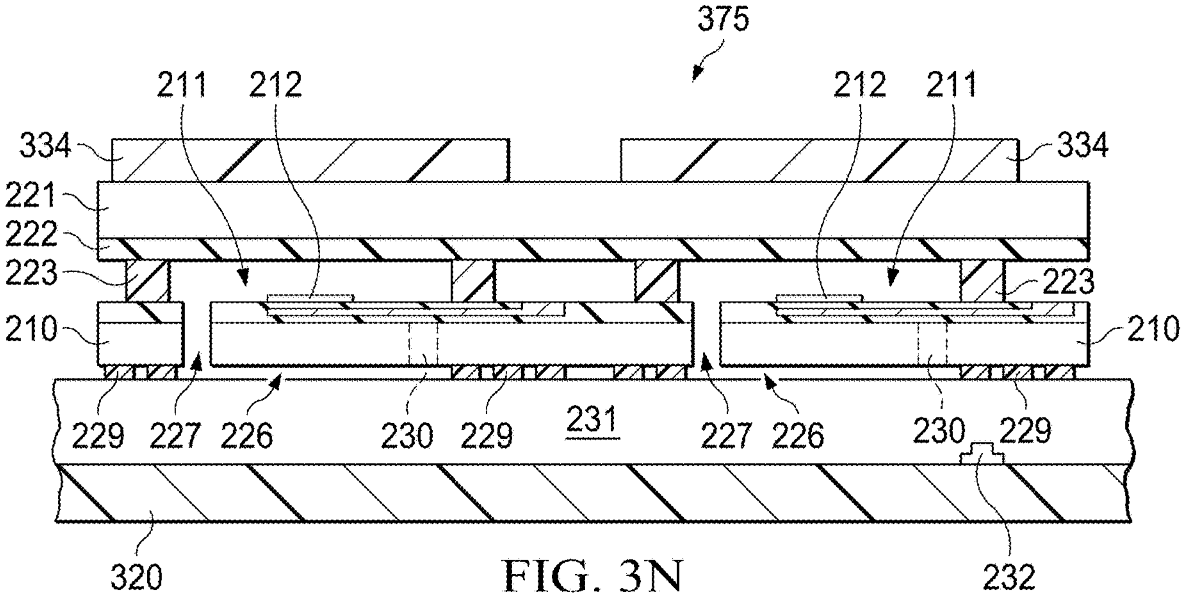
Figure 3O:
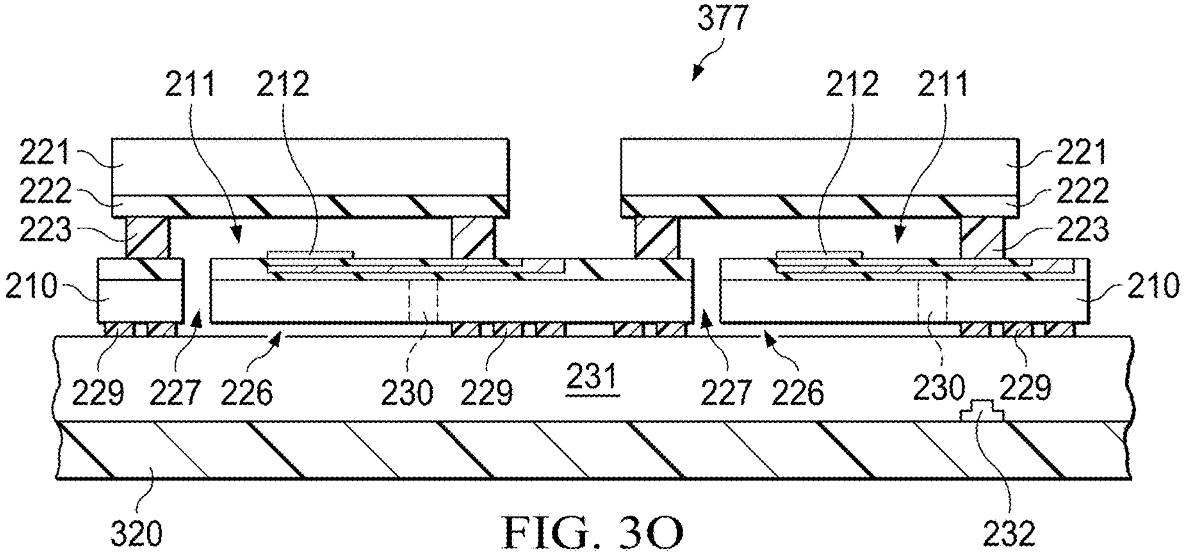
Figure 3P:
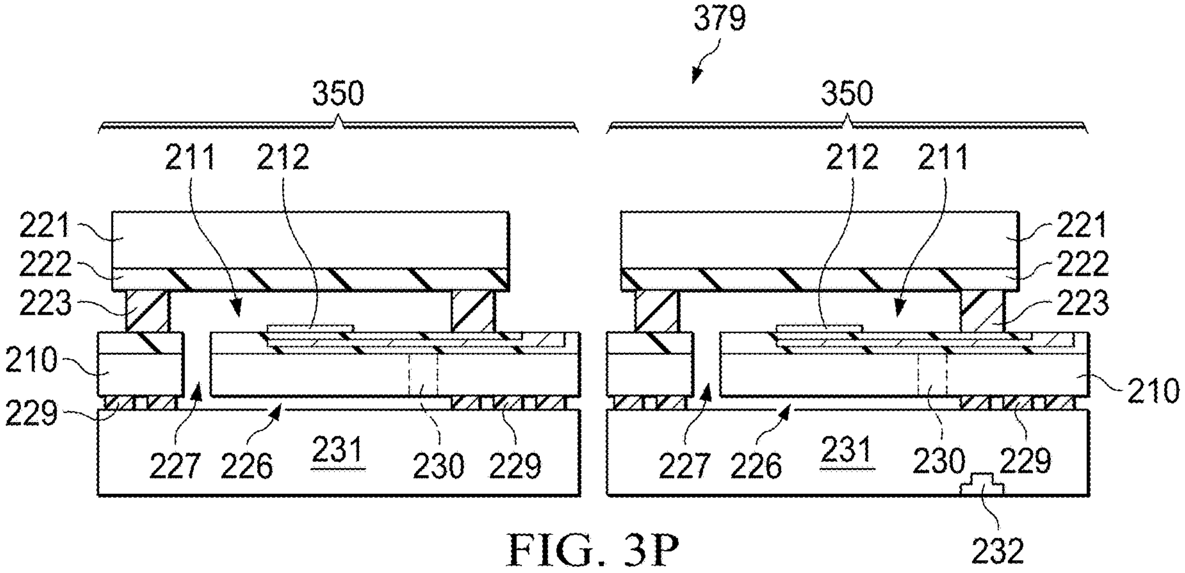

FIGS. 3A-3P illustrate, in a series of cross sections, selected steps of a method for forming a microelectronics device package of the arrangements. In FIG. 3A, at a step 351, a second semiconductor substrate 221 with a dielectric layer 222 is shown. In an example, the second semiconductor substrate 221 can be a “dummy” substrate without any electronic devices formed on it. In an alternative example, electronic components can be formed in the second semiconductor substrate. A dielectric layer 222 is formed, which can be an oxide layer such as a thermal oxide, or can be another oxide or dielectric deposited on the semiconductor substrate 221.

FIG. 3B illustrates in another cross section a step 353 that continues the method. At step 353, the second semiconductor substrate 221 is shown after additional processing. An alignment mark 225 is shown formed on a backside surface of the second semiconductor substrate 221, and side edges 224 are shown etched on the sides of the second semiconductor substrate 221. In the arrangements, a wafer level encapsulation process is performed to manufacture the unit semiconductor devices and so at this stage of the process, the second semiconductor substrate 221 is a semiconductor wafer.

At step 355 in FIG. 3C, the second semiconductor substrate 221 is shown after additional processing. The first seal 223 is shown formed on a device side surface of the second semiconductor substrate 221, and is patterned to form sidewalls in locations that correspond to the MEMS components. The sidewalls of the first seal 223 are shown in cross section but form square or rectangular shapes that surround locations corresponding to the MEMS devices. The first seal 223 can be formed of a polymer, and in an example process, a photoresist polymer is used. In a particular example, a cross linking negative photoresist polymer such as SU-8, which is commercially available from vendors including Kayaku Advanced Materials of Japan can be used, although other photoresist polymers can be patterned and used. The sidewalls of the first seal 223 extend away from a device side surface of the second semiconductor substrate 221 and use of first seal 223 will form a vertical gap over the MEMS devices when a wafer bonding process is performed.

FIG. 3D illustrates in a cross sectional view a first semiconductor substrate 210, which at this stage in the method is also a semiconductor wafer. The MEMS components 212 are shown formed on a device side surface of the second semiconductor substrate 210. The first semiconductor substrate 210 can be formed independently of the processing for the second semiconductor substrate 221 and can be formed at a different time, and at a different location, than the second semiconductor substrate 221.

FIG. 3E illustrates in another cross section a step 357 of the method. At step 357 first semiconductor substrate 210 including MEMS components 212 (see FIG. 3D) is shown bonded to the second semiconductor substrate 221 using a wafer bonding process. Thermal energy and compression are used to bond the first seal 223, which is a polymer, to the first semiconductor substrate 210, and the first seal 223 forms sidewalls surrounding the MEMS devices 212 on the first semiconductor substrate 210, while the second semiconductor substrate 221 forms a cap or lid over the MEMS devices 212.

FIG. 3F illustrates in another cross section a step 359 of the method. At step 359, the first semiconductor substrate 210 is shown after being subjected to a backgrinding process that thins the first semiconductor substrate 210 by a chemical or mechanical etch process. In an example a chemical mechanical polishing (CMP) process can be used. The first semiconductor substrate 210, which at this point in the process is a semiconductor wafer, can be as thick as 700 microns at the beginning of the process, although other thicknesses can be used. The thinning process can result in the first semiconductor substrate 210 being as thin as 10 microns up to 300 microns after backgrinding is complete.

In FIG. 3G, another cross section is shown illustrating a step 361 to show additional processing of the method. At step 361, the now thinned first semiconductor substrate 210 is shown bonded to the second semiconductor substrate 221 and having a photoresist 333 patterned on the backside surface to prepare for a plasma etch process.

At step 363 shown in FIG. 3H, the method continues. Trenches 227 are shown formed from by etching from the backside surface of the first semiconductor substrate 210 and extending through the first semiconductor substrate 210. In this example process, the trenches 227 can be “C” shaped when viewed in a plan view and partially surround the MEMS component 212, while a portion 230 of the first semiconductor substrate 210 is not etched. The MEMS component 212 will then be supported in a cantilever fashion by a small portion 230 of the first semiconductor substrate 210 that is not etched during the etch process, while the trench 227 surrounds the MEMS component 212 on three sides and a portion of the remaining fourth side (see the plan view in FIG. 4A, and the accompanying description, below). The formation of the trench 227 mechanically stress releases the MEMS component 212.

The method continues as shown in FIG. 3I, at step 365. As shown in the cross section of FIG. 3I, at step 365 the third semiconductor substrate 231 is prepared for bonding by placing an alignment mark 232 and by patterning the second seal 229 on a device side surface of the third semiconductor substrate 231. The second seal 229 can be formed of a photoresist polymer that is the same as, or different from, the material used for the first seal 223. The polymer can be a photoresist material that crosslinks when exposed to light of a certain frequency, such as UV light, as described above. Unexposed polymer can then be removed to leave the patterned second seal 229.

FIG. 3J illustrates another step 367 as the method continues. At step 367, the MEMS component 212 is shown after additional processing. The third semiconductor substrate 231 is shown bonded to the backside surface of the first semiconductor substrate 210, and positioned so that the second seal 229 forms sidewalls that surround the MEMS device 212. The bonding is done in a wafer bonding process that includes bringing the second seal 229 into contact with the backside surface of the first semiconductor substrate 210, and applying thermal energy and mechanical pressure to form the bond. The gap 226 between the third semiconductor substrate 231 and the backside surface of the first semiconductor substrate 210 forms part of the cavity 211 along with the trench 227 to surround the MEMS component 212.

An additional cross section shown in FIG. 3K, showing another step 369 of the method. FIG. 3K illustrates the MEMS component 212 after additional processing. In step 369 a wafer thinning process is applied to the backside surface of the second semiconductor substrate 221. A chemical etch, mechanical thinning, or a chemical mechanical polishing process can be used to thin the wafer.

At FIG. 3L, another cross section illustrates additional processing of the method at a step 371. At step 371, a photoresist 334 is patterned on the backside surface of the second semiconductor substrate 221 to prepare for a singulation process. The photoresist 334 is selected to be compatible with a silicon etch process such as a plasma etch for silicon. In an example a deep reactive ion etching (DRIE) process can be used.

At FIG. 3M, a cross section illustrates further processing as the method continues to step 373. At step 373, the semiconductor substrate 231 is shown following an additional wafer thinning process. The wafer thinning process is applied to the backside surface of the third semiconductor substrate 231 and can be a chemical mechanical polishing process, an etch, or a mechanical thinning process.

FIG. 3N illustrates, in another cross section, a step 375 as the method continues. In step 375, the backside surface of the third semiconductor substrate 231 is mounted on a wafer dicing tape 320. Wafer dicing tape is removable to provide a temporary support to a wafer or structure while singulation and bond pad reveal processes are being performed. The wafer dicing tape 320 can be peelable tape and removed by mechanical force, or can be a UV release type tape that releases when the adhesive is exposed to UV light, or can be a wafer dicing tape that is removed by a chemical release.

FIG. 30 illustrates in a further cross section a step 377 of the method. At step 377, the second semiconductor substrate 221 is shown after additional processing. A plasma silicon etch can be used to remove silicon in the saw street and other areas while keeping a cap area between devices, and to open a space between unit devices in the second semiconductor substrate and to reveal bond pads 245.

FIG. 3P illustrates in another cross section an additional step in the method at step 379. In step 379 unit devices 350 are shown separated apart after a wafer dicing operation. In one example process a dicing saw cuts through the first semiconductor substrate 210 and the third semiconductor substrate 231 using the wafer dicing tape. After the sawing process, the wafer dicing tape can be stretched to separate the unit devices apart, and the unit semiconductor devices 350 can be removed from the wafer dicing tape.

Each unit device 350 shown in the cross section of FIG. 3P includes a MEMS component 212 in a cavity 211 that is formed in a wafer level encapsulation process. The cavity 211 is formed with the second semiconductor substrate 221 forming a cap, the first seal 223 forming a sidewall around the MEMS component 212, the trench 227 opening that partially surrounds the MEMS component, and the gap 226 with a bottom surface formed by the third semiconductor substrate 231 and sealed by the second seal 229 that surrounds the MEMS component. In an example the MEMS component 212 is a BAW device. The MEMS component 212 is mechanically stress released from the semiconductor substrate 210 by the trench 227, and is spaced from and isolated from any mold compound applied to package the unit device by the first seal 223, the second seal 229, the second semiconductor substrate 221, and the third semiconductor substrate 231.

Figure 4A:
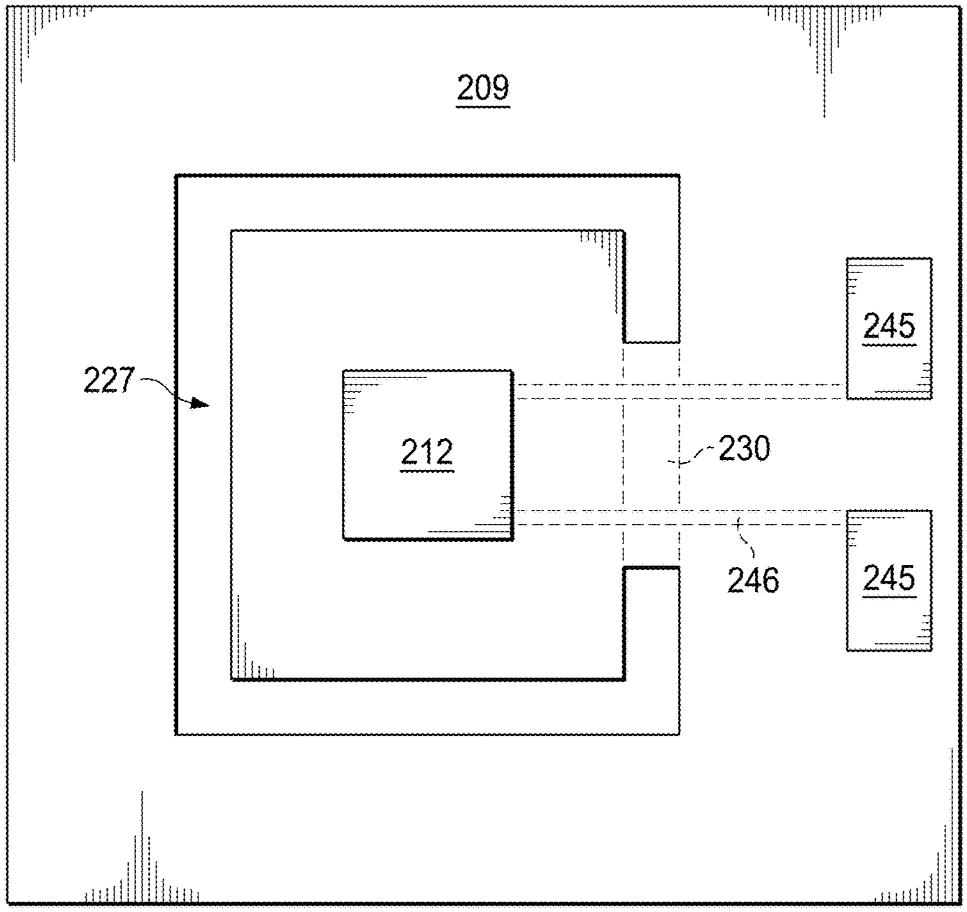
FIGS. 4A-4B illustrate in a plan view and in a cross section, respectively, details of a MEMS component of an arrangement.
Figure 4B:
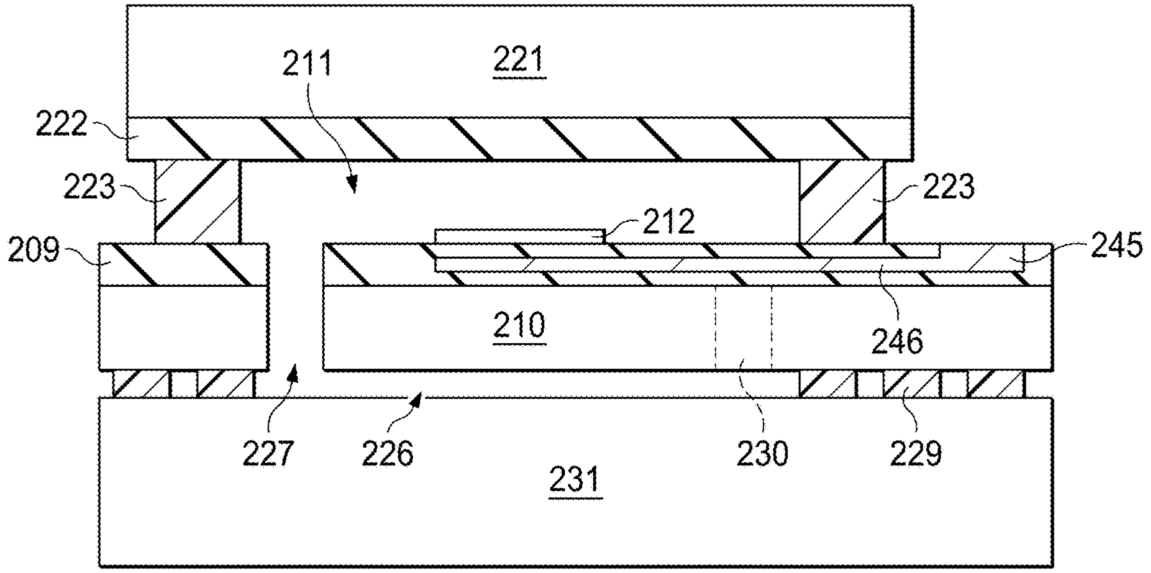
Figure 5A:
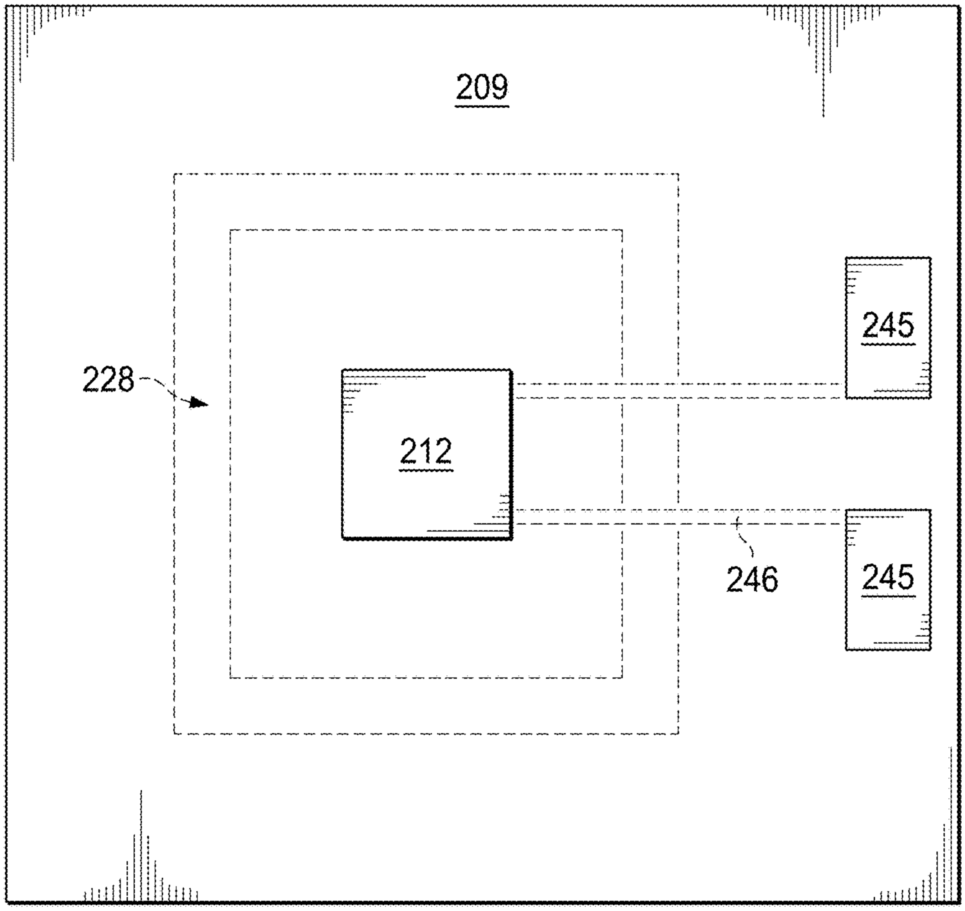
FIGS. 5A-5B illustrate in a plan view and a cross section, respectively, details of a MEMS device of an alternative arrangement.
Figure 5B:
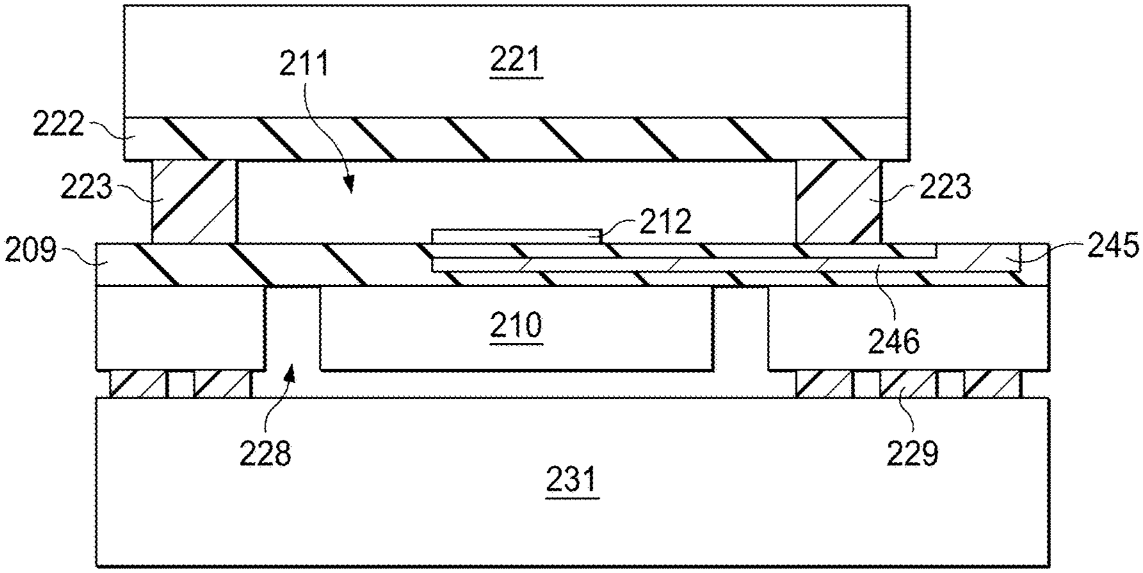

FIGS. 4A-4B illustrate various aspects of an example arrangement in further detail in a plan view, and a cross sectional view, respectively. In the plan view of FIG. 4A, the trench 227 is shown as a "C" shape partially surrounding the MEMS component 212. Traces 246 connect the MEMS component 212 to bond pads 245. The trench 227 in the example arrangement of FIGS. 4A and 4B is open and extends through the first semiconductor substrate 210, and will connect to the space between the first semiconductor substrate 210 and the second semiconductor substrate 221 to form part of the cavity 211. A portion 230 of the semiconductor substrate 210 is not etched in this arrangement and mechanically supports the MEMS component 212 in a cantilever fashion FIGS. 5A-5B illustrate in a plan view, and a cross sectional view, an alternative arrangement for a unit semiconductor device. In FIG. 5A, an "0" shaped trench 228 is shown surrounding the MEMS component 212. (See steps 361, 363 in FIG. 3A, where the trench is patterned and etched). Trench 228 is formed extending through the semiconductor substrate 210 but not extending through a protective overcoat layer 209 that then supports the MEMS component 212. The bond pad 245 is connected to the component 212 by a trace 246 that also supports the MEMS component 212. In this alternative arrangement, the MEMS component 212 is spaced from the remainder of the first semiconductor substrate 210 by the trench 228 which surrounds the MEMS component 212.

Figure 6A:
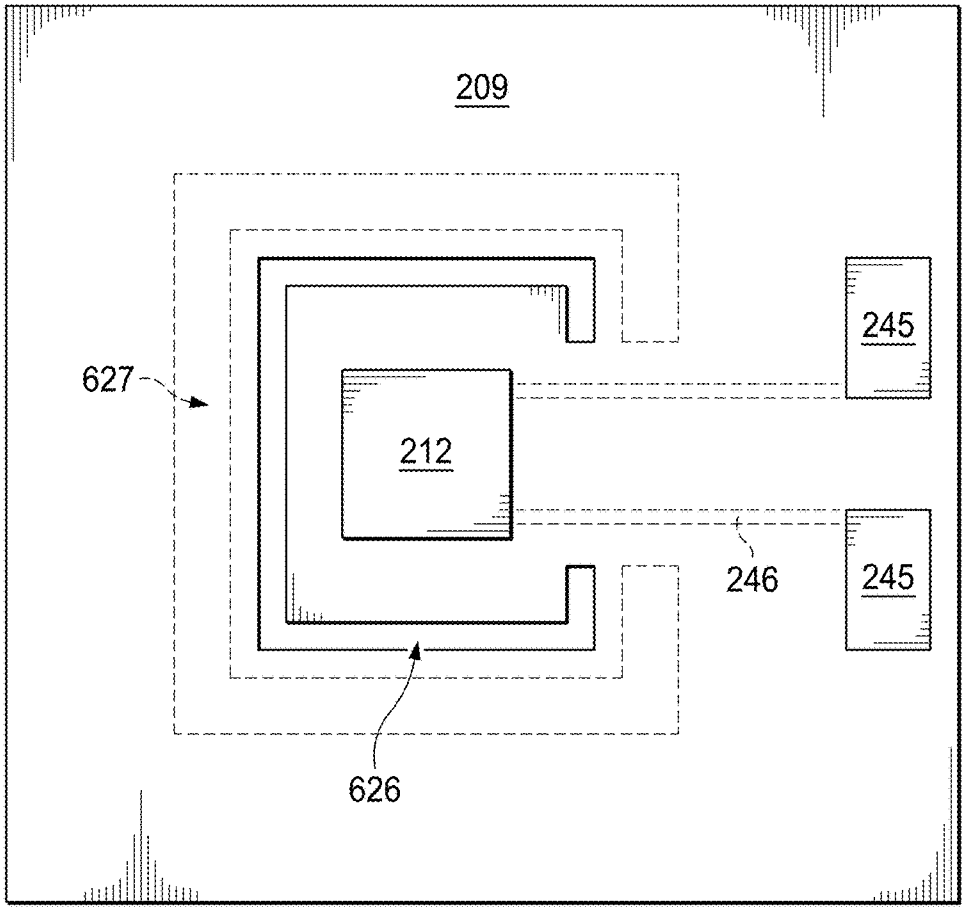
FIGS. 6A-6B illustrate in a plan view and a cross section, respectively, details of a MEMS device in another alternative arrangement.
Figure 6B:
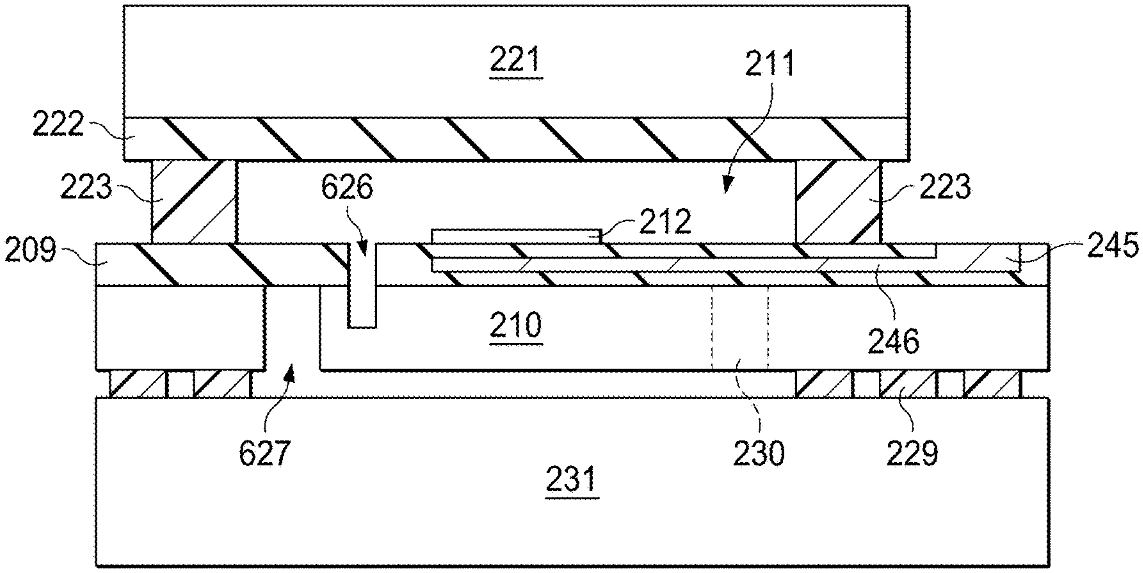

FIGS. 6A-6B illustrate, in a further plan view and a corresponding cross section, respectively, additional details of another arrangement. In FIG. 6A, in addition to a C shaped trench 627 that is formed in the first semiconductor substrate 210 from the backside as described above, a second trench 626 is shown. Trench 626 is an additional C shaped trench that is formed from the device side surface of the first semiconductor substrate 210 prior to the wafer bonding processes described above. In the example the C shaped trench 626 lies inside an inner boundary of the C shaped trench 627. Other shapes and arrangements can be used, for example "G" shaped and round shapes can be used.

As shown in FIG. 6B, trench 626 is formed partially surrounding the MEMS component 221. Trench 626 is formed in the first semiconductor substrate 210 prior to wafer bonding the second semiconductor substrate 221 to the first semiconductor substrate 210 (see step 357 in FIG. 3A). Trench 626 extends into the first semiconductor substrate 210 but not through it, adding additional mechanical stress release around the MEMS component 212. The cross section in FIG. 6B illustrates the trench 626 and the trench 628, and a cantilever portion 230 of the first semiconductor substrate 210 that is not etched supports the MEMS component 212, trace 246 and the protective overcoat 209 are shown over the first semiconductor substrate 210.

Figure 7A:
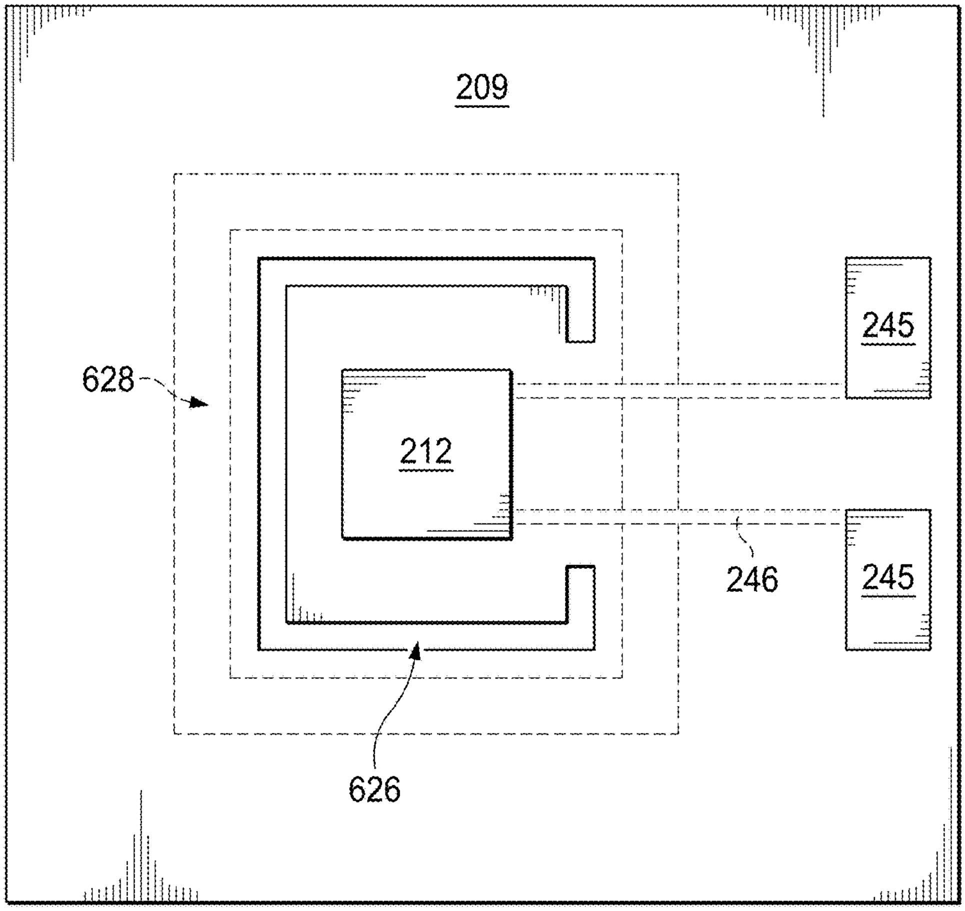
FIGS. 7A-7B illustrate in a plan view and a cross section, respectively, details of a MEMS device of an additional alternative arrangement.

FIG. 7A illustrates, in a plan view and a cross sectional view, details of an additional arrangement. In FIG. 7A, a plan view of the first semiconductor substrate 210 is shown with an O shaped trench 628 that is formed using a backside etch process as described above, and in combination with a C shaped trench 626 that is formed by an etch from the device side surface of the first semiconductor substrate 210 that is formed prior to the wafer bonding steps described above.

Figure 7B:
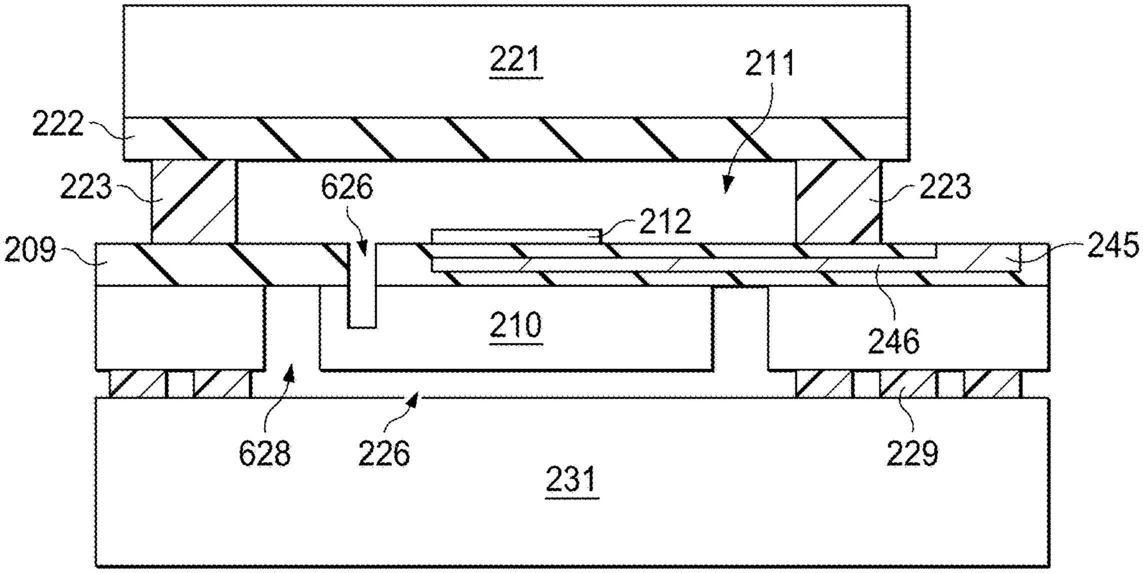

FIG. 7B illustrates, in a cross sectional view, an additional arrangement using the trenches shown in FIG. 7A for a unit semiconductor device. In FIG. 7B, the trench 628 is shown extending from the backside surface of the first semiconductor substrate 210 to, but not through, the protective overcoat layer 209. The trench 626 is formed into, but not extending through, the first semiconductor substrate 210 and through the protective overcoat 209 in a C shape, with a portion of the protective overcoat 209 remaining to support the MEMS component 212.

In FIGS. 4A-4B, FIGS. 5A-5B, FIGS. 6A-6B and FIGS. 7A-B, different example arrangements for mechanical stress release of a MEMS component are shown as alternatives. A design choice of which of the approaches is best suited to a particular device can be made based on design flexibility, device performance and cost. For example, the use of the two trenches where one is formed from the front side of the first semiconductor substrate (see FIGS. 6A-6B and FIGS. 7A-7B) adds process steps over the single backside trench of FIGS. 4A-4B, and a cost vs. performance analysis can be used to determine whether the additional cost is needed for a given application.

Figure 8A:
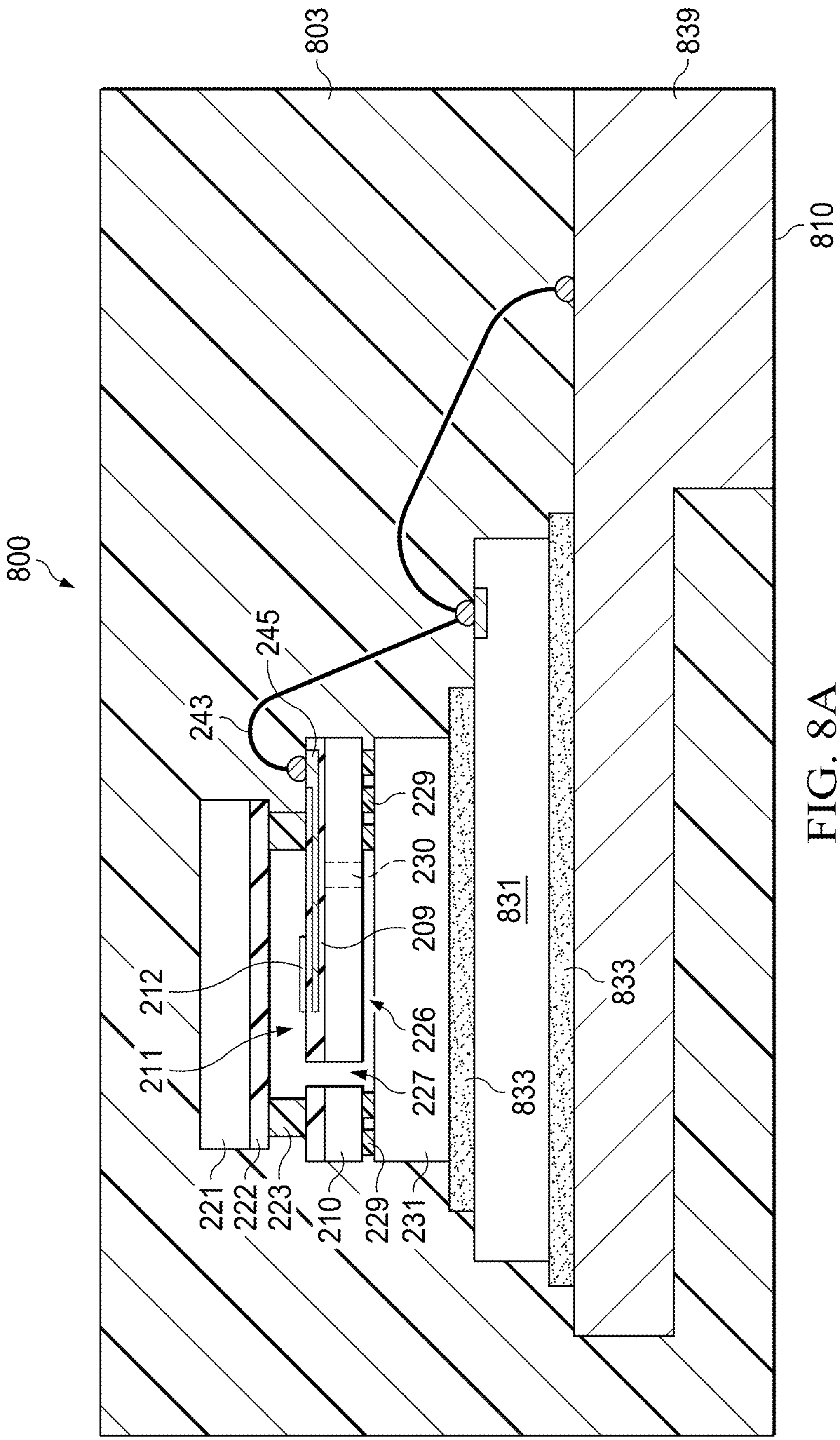
FIGS. 8A-8B illustrate in cross sectional views microelectronics device packages including MEMS components of the arrangements.
Figure 8B:
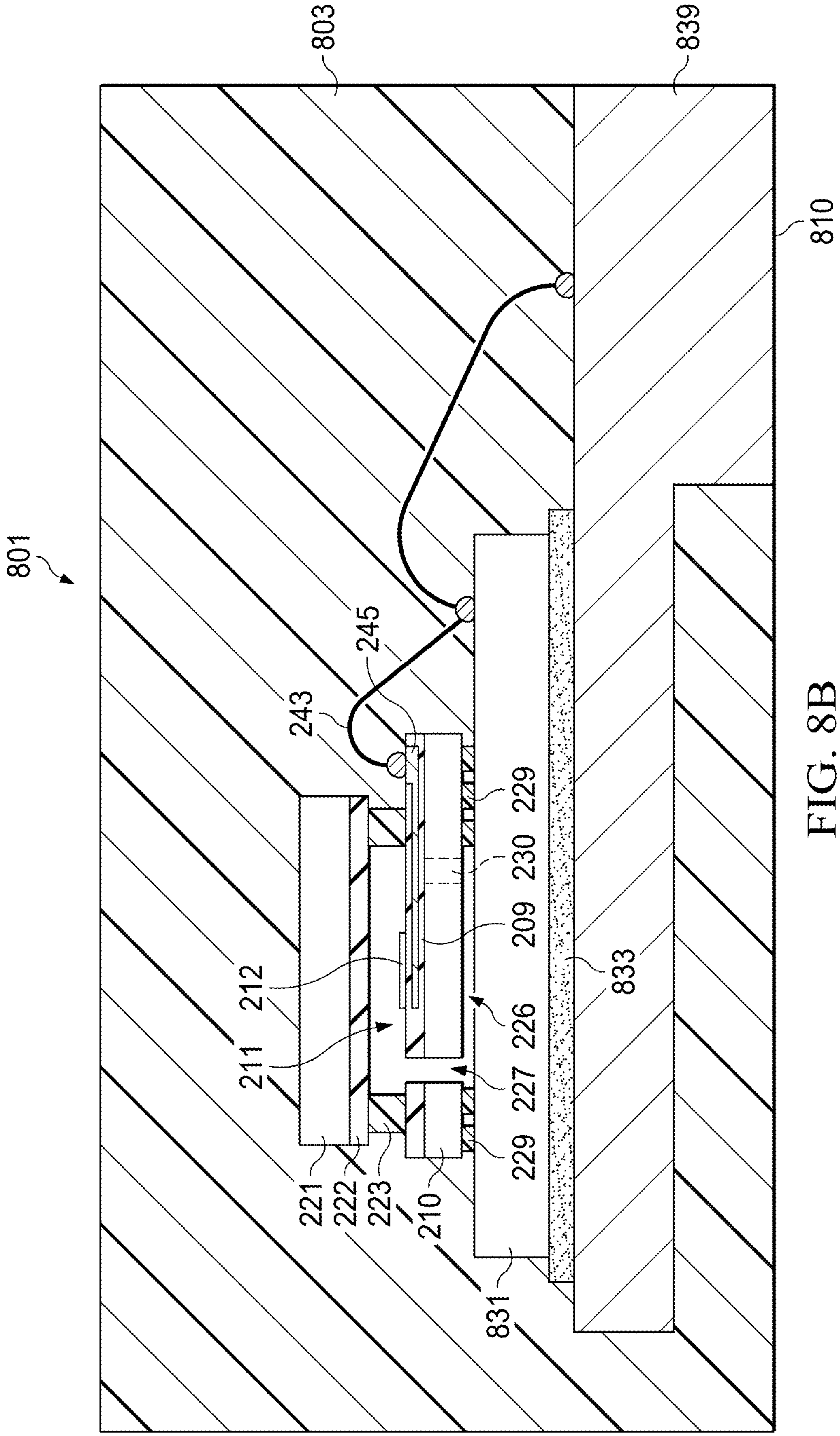

FIGS. 8A-8B illustrate, in cross sectional views, two alternative arrangements for microelectronic device packages including a semiconductor device that is a MEMS component in a cavity formed using the methods described above.

In FIG. 8A, a package substrate 839, which in this illustrative example is a metal lead frame, is used in microelectronic device package 800. A MEMS component 212 is shown on a first semiconductor substrate 210. A second semiconductor substrate 221 is bonded to a device side surface of the first semiconductor substrate 210 by a first seal 223 that surrounds the MEMS component 212, forming a cavity 211 with a cap formed by the second semiconductor substrate 221. A third semiconductor substrate 231 is shown spaced from the bottom surface of the first semiconductor substrate 210 and bonded to the first semiconductor substrate 210 by a second seal 229. The first seal 223 and the second seal 229 can be formed using a photoresist polymer material. An additional semiconductor device 831 is mounted to a die pad area on a die side surface of the package substrate 839 by a die attach material 833. Die attach material 833 is also used to mount a backside surface of the third semiconductor substrate 231 to the additional semiconductor device die 831. A bond wire 243 connects the MEMS device 212 to the additional semiconductor device die 831, and further to a lead of the package substrate 839, to form a circuit. In an example the MEMS device 212 is a BAW device, and the additional semiconductor device die can be a device driver for the BAW device. A mold compound 803 covers a portion of the package substrate 839, while another portion is exposed to form a terminal 810 for the microelectronic device package 800.

In FIG. 8B, a cross sectional view illustrates an alternative microelectronics device package using the MEMS component with a cavity in a semiconductor device as described above. In the arrangement of FIG. 8B, the third semiconductor substrate 231 (see FIG. 8A) is omitted, instead, the another semiconductor device 831, which can be a driver device, is bonded to the backside surface of the first semiconductor substrate 210 and spaced from the first semiconductor substrate 210 by the second seal 229, which is a photoresist polymer as described above. In this arrangement, the bond pad layout for the another semiconductor device 831 may need to be modified to accommodate the wafer bonding and wire bonding with the first semiconductor substrate 210 to form the MEMS component in the cavity 211. In contrast, the arrangement of FIG. 8A can use the existing bond pad layout for the another semiconductor device die 831, without need to modify the design. However, the arrangement of FIG. 8A uses an additional third semiconductor substrate 231 that is not needed in the arrangement of FIG. 8B. Also, referring to FIG. 2A, the MEMS component including the cavity of the arrangements can be provided in a microelectronics device package without an additional semiconductor device, as a discrete component. Additional devices such as passive components can be packaged with the MEMS component such as resistors, capacitors, inductors, and sensors.

Figure 9:
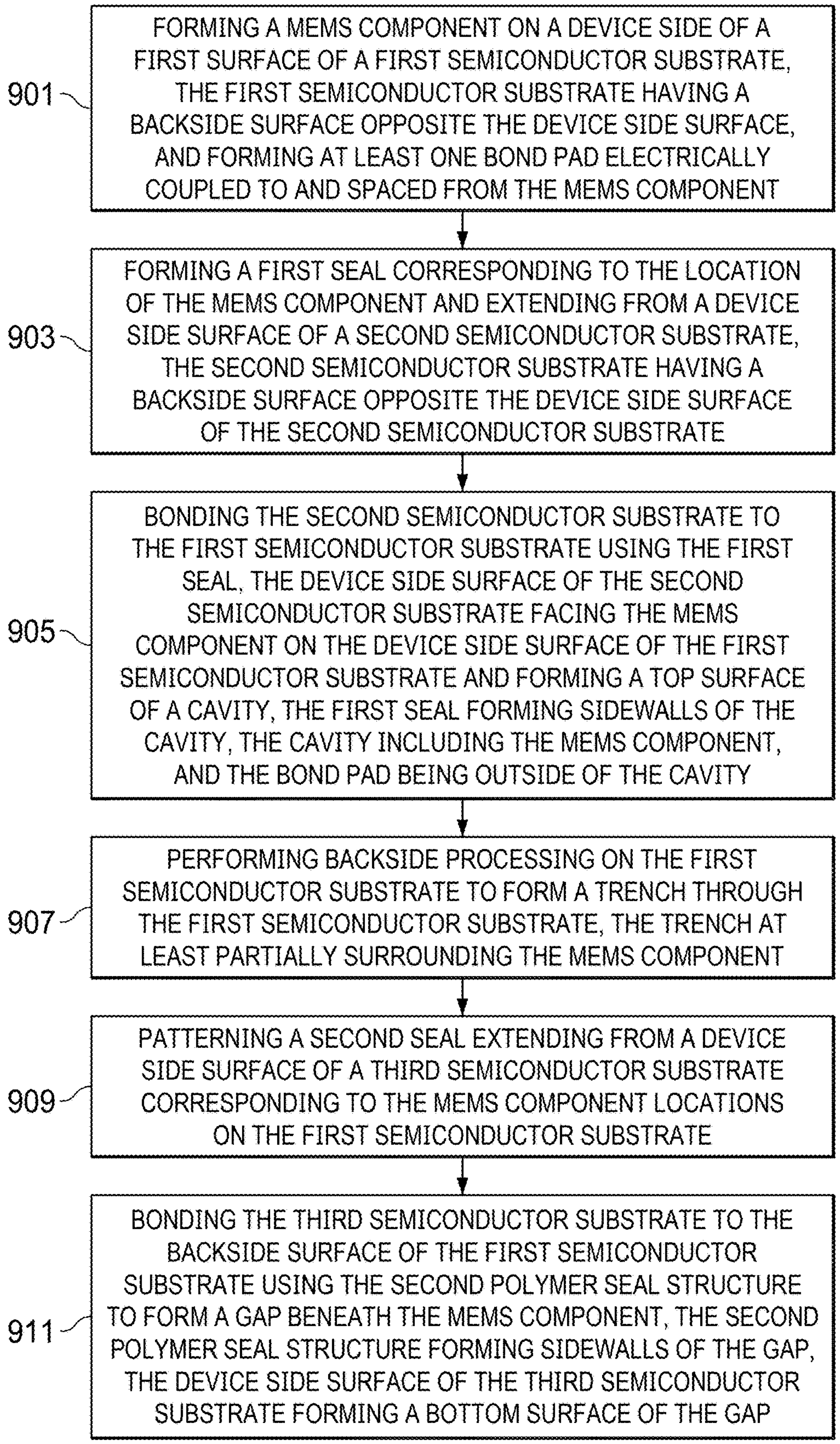
FIG. 9 illustrates in a flow diagram selected steps of a method for forming example arrangements.

FIG. 9 illustrates, in a flow diagram, a method for forming an example arrangement. Certain steps of FIG. 9 can be done independently from one another, and at different times, as described below. The order of steps can be varied.

At step 901, on a first semiconductor substrate, a MEMS component is formed on a device side surface. The first semiconductor substrate has a backside surface opposite the device side surface. In an example the MEMS component can be a BAW device. A bond pad is formed on the device side surface of the first semiconductor substrate that is electrically coupled to the MEMS component, the bond pad is spaced from the MEMS component.

At step 903, in an independent process step, a first seal is formed on a second semiconductor substrate corresponding to the location of the MEMS component, the second seal extending from a device side surface of the second semiconductor substrate, the second semiconductor substrate having a backside surface opposite the device side surface of the second semiconductor substrate. The second semiconductor substrate can be a dummy semiconductor wafer, and can be of silicon or of another semiconductor material. In an example arrangement, the second semiconductor substrate is of the same type of material as the first semiconductor substrate, and both are provided as semiconductor wafers to use in a wafer level encapsulation process. Using the same semiconductor material provides material with similar coefficient of thermal expansion (CTE) parameters, which results in less thermal stress over the life of a microelectronic device including the materials.

The first seal can be of a polymer and in an example process, a photoresist polymer is used. SU-8 photoresist is an example polymer that can be used in the arrangements.

At step 905 of the method in FIG. 9A, the second semiconductor substrate is bonded to the first semiconductor substrate using the first seal. After putting the first seal in contact with the device side surface of the first semiconductor substrate, so that the device side surface of the second semiconductor substrate is facing the MEMS component on the first semiconductor substrate, a thermal and compression wafer bonding process is performed to bond the two wafers together, spaced apart by a distance. A cavity is formed with the top surface formed by the device side surface of the second semiconductor substrate, and the first seal forming sidewalls of the cavity surrounding the MEMS component, with the bond pad outside of the cavity.

The method continues at step 907 shown in FIG. 9B. In step 907, backside processing is performed on the first semiconductor substrate to etch and form a trench through the first semiconductor substrate, the trench at least partially surrounding the MEMS component. (See, for example, the trench 227 in FIG. 4A, and in FIG. 4B). The trench can completely surround the component (see trench 228 in FIG. 5A, FIG. 5B).

At step 909, the method continues by patterning a second seal on the device side surface of a third semiconductor substrate, the second seal corresponding to the MEMS component locations on the first semiconductor substrate. In an example the third semiconductor substrate can be a dummy semiconductor wafer, or in an alternative example, the third semiconductor substrate can include another semiconductor device that is configured to be coupled to the MEMS component to form a circuit.

At step 911, the third semiconductor substrate is bonded to the backside surface of the first semiconductor substrate using the second seal to bond the wafers. An example process includes thermal energy and mechanical pressure to bond the third semiconductor substrate to the first semiconductor substrate, with a spacing between the backside surface of the first semiconductor substrate and the third semiconductor substrate due to the second seal. In an example the second seal can be formed of the polymer photoresist described above. A gap beneath the first semiconductor substrate is sealed by the second seal and the third semiconductor substrate, and forms part of the cavity surrounding the MEMS component.

After the wafer bonding processes are completed, unit semiconductor devices can be formed by singulating the bonded wafers apart along scribe lanes between the devices. Conventional packaging processes can be used to mount the unit semiconductor devices to a package substrate, make electrical connections using wire bonding or ribbon bonding, and encapsulate the devices using mold compound.

By using wafer level encapsulation processes to form the arrangements, use of the arrangements is economical and effective in reducing mechanical stress on the MEMS components due to mold compound stress. By eliminating the need for the glob top low modulus material used in prior approaches, the size of the MEMS component and the overall package size can be reduced because the bond pad positions and spacing in the arrangements is more flexible than in prior approaches. Modifications are possible in the described arrangements, and other alternative arrangements are possible within the scope of the claims.

What is claimed is:

1. A method, comprising:

forming a micro-electromechanical system (MEMS) component on a device side surface of a first semiconductor substrate, the first semiconductor substrate having a backside surface opposite the device side surface, and forming at least one bond pad electrically coupled to and spaced from the MEMS component;

forming a first polymer seal structure corresponding to the location of the MEMS component and extending from a device side surface of a second semiconductor substrate, the second semiconductor substrate having a backside surface opposite the device side surface of the second semiconductor substrate;

bonding the second semiconductor substrate to the first semiconductor substrate using the first polymer seal structure, the device side surface of the second semiconductor substrate facing the MEMS component on the device side surface of the first semiconductor substrate and forming a top surface of a cavity, the first polymer seal structure forming sidewalls of the cavity, the cavity including the MEMS component, and the bond pad being outside of the cavity;

performing backside processing on the first semiconductor substrate to form a trench starting from the backside surface of the first semiconductor substrate, through a portion of the first semiconductor substrate, the trench at least partially surrounding the MEMS component;

patterning a second polymer seal structure extending from a device side surface of a third semiconductor substrate corresponding to the MEMS component locations on the first semiconductor substrate; and bonding the third semiconductor substrate to the backside surface of the first semiconductor substrate using the second polymer seal structure to form a gap beneath the MEMS component, the second polymer seal structure forming sidewalls of the gap, the device side surface of the third semiconductor substrate forming a bottom surface of the gap.

2. The method of claim 1, and further comprising:

performing backside processing on the backside surface of the second semiconductor substrate and patterning a photoresist to define saw streets between a plurality of MEMS components formed on the first semiconductor substrate;

etching through the backside surface of the second semiconductor substrate in the saw streets to expose the device side surface of the first semiconductor substrate in the saw streets; and dicing the first semiconductor substrate and the third semiconductor substrate by cutting through the first semiconductor substrate and the third semiconductor substrate in the saw streets to form individual MEMS devices, the MEMS devices positioned in the cavities and having air in the trenches and in the gaps.

3. The method of claim 2, and further comprising:

mounting an individual MEMS device to a die mount area on a package substrate having a conductive lead using a die attach material;

electrically coupling the bond pad of the MEMS device to the conductive lead using a bond wire or a ribbon bond;

covering the individual MEMS device, the bond pad, the bond wire or ribbon bond, and a portion of the package substrate with a mold compound; and leaving a portion of the package substrate having electrical terminals exposed from the mold compound to form a microelectronics device package.

4. The method of claim 3, wherein the package substrate is a metal lead frame, a multilayer package substrate, a partially molded lead frame, a molding interconnect substrate, or a printed circuit board.

5. The method of claim 2, wherein the third semiconductor substrate is a semiconductor device including electrical components and the MEMS component is electrically coupled to the third semiconductor substrate using a bond wire or ribbon bond.

6. The method of claim 2, and further comprising:

mounting an individual MEMS device a fourth semiconductor substrate that including electrical components to be coupled to the MEMS device;

mounting the fourth semiconductor substrate to a die mount area on a package substrate having a conductive lead using a die attach material;

electrically coupling the bond pad of the MEMS device to the fourth semiconductor substrate using a bond wire or a ribbon bond;

electrically coupling the fourth semiconductor substrate to a lead on the package substrate using a bond wire or a ribbon bond;

covering the individual MEMS device, fourth semiconductor substrate, the bond wires or ribbon bonds, and a portion of the package substrate with a mold compound; and leaving a portion of the package substrate having electrical terminals exposed from the mold compound to form a microelectronics device package.

7. The method of claim 6, wherein the fourth semiconductor substrate is a driver die for the MEMS component.

8. The method of claim 7, wherein the MEMS component is a bulk acoustic waver (BAW) device.

9. The method of claim 1, wherein forming a MEMS component further comprises forming a transducer, a temperature sensor, a pressure sensor, an optical sensor, a micromirror, an acoustic sensor, or a bulk acoustic wave (BAW) device.

10. The method of claim 1, wherein forming a MEMS component comprises forming a BAW device.

11. The method of claim 1, wherein performing backside processing on the first semiconductor substrate to form a trench through the first semiconductor substrate, the trench at least partially surrounding the MEMS component further comprises performing a plasma silicon etch to form a trench through the first semiconductor substrate in a C shape, leaving a portion supporting the MEMS component on one side.

12. The method of claim 1, wherein performing backside processing on the first semiconductor substrate to form a trench through the first semiconductor substrate, the trench at least partially surrounding the MEMS component further comprises performing a plasma silicon etch to form a trench through the first semiconductor substrate in an O shape but stopping before etching through a protective dielectric on the device side surface of the first semiconductor substrate, the protective dielectric supporting the MEMS component.

13. The method of claim 1, and further comprising:

prior to bonding the second semiconductor substrate to the first semiconductor substrate, performing a front side etch on the first semiconductor substrate to form a trench in a C shape surrounding the MEMS component, leaving a portion of a protective dielectric supporting the MEMS component on one side; and wherein performing backside processing on the first semiconductor substrate to form a trench through the first semiconductor substrate, the trench at least partially surrounding the MEMS component further comprises performing a plasma silicon etch on the backside surface of the first semiconductor substrate to form a trench through the first semiconductor substrate in an O shape but stopping before etching through a protective dielectric on the device side surface of the first semiconductor substrate, the protective dielectric supporting the MEMS component.

14. The method of claim 1, and further comprising:

prior to bonding the second semiconductor substrate to the first semiconductor substrate, performing a front side etch on the first semiconductor substrate to form a trench in a C shape surrounding the MEMS component, leaving a portion of a protective dielectric supporting the MEMS component on one side; and wherein performing backside processing on the first semiconductor substrate to form a trench through the first semiconductor substrate, the trench at least partially surrounding the MEMS component further comprises performing a plasma silicon etch on the backside surface of the first semiconductor substrate to form a trench through the first semiconductor substrate in an C shape, a portion of the first semiconductor substrate supporting the MEMS component on one side.

* * * * *